United States Patent
Watanabe et al.

(10) Patent No.: US 6,177,343 B1
(45) Date of Patent: Jan. 23, 2001

(54) PROCESS FOR PRODUCING SEMICONDUCTOR DEVICES INCLUDING AN INSULATING LAYER WITH AN IMPURITY

(75) Inventors: Hiroyuki Watanabe; Hideki Mizuhara, both of Bisai; Kaori Misawa, Gifu-ken; Masaki Hirase, Yokohama; Hiroyuki Aoe, Joyo, all of (JP)

(73) Assignee: Sanyo Electric Co., Ltd., Osaka (JP)

( * ) Notice: Under 35 U.S.C. 154(b), the term of this patent shall be extended for 0 days.

(21) Appl. No.: 09/429,698

(22) Filed: Oct. 28, 1999

Related U.S. Application Data

(60) Division of application No. 08/877,931, filed on Jun. 18, 1997, and a continuation-in-part of application No. 08/528,123, filed on Sep. 14, 1995, now abandoned.

(51) Int. Cl.[7] .................................................. H01L 21/4763
(52) U.S. Cl. ............................................. 438/639; 438/639
(58) Field of Search .................................... 438/453, 639, 438/635, 637, 647, 659, 684, 687, 702, 563, 546

(56) References Cited

U.S. PATENT DOCUMENTS

| | | |
|---|---|---|
| 4,962,052 | 10/1990 | Asayama et al. . |
| 4,984,055 | 1/1991 | Okumura et al. . |
| 5,186,745 | 2/1993 | Maniar . |
| 5,192,697 | 3/1993 | Leong . |
| 5,270,259 | 12/1993 | Ito et al. . |
| 5,314,834 | 5/1994 | Muzuré et al. . |
| 5,468,684 | 11/1995 | Yoshimori et al. . |
| 5,496,776 | 3/1996 | Chien et al. . |
| 5,569,618 | 10/1996 | Matsubara . |
| 5,786,273 * | 7/1998 | Hibi et al. .............................. 438/637 |
| 5,817,582 | 10/1998 | Maniar . |
| 5,855,962 | 1/1999 | Cote et al. . |
| 5,930,624 | 7/1999 | Murata et al. ......................... 438/253 |
| 5,963,827 * | 10/1999 | Enomoto et al. ..................... 438/629 |
| 6,013,578 * | 1/2000 | Jun ....................................... 438/687 |

FOREIGN PATENT DOCUMENTS

| | | |
|---|---|---|
| 62-60242 | 3/1987 | (JP) . |
| 1-199456 | 8/1989 | (JP) . |
| 2-26055 | 1/1990 | (JP) . |
| 2-7451 | 1/1990 | (JP) . |
| 2-253643 | 10/1990 | (JP) . |
| 3-101130 | 4/1991 | (JP) . |
| 4-234149 | 8/1992 | (JP) . |
| 4-317358 | 11/1992 | (JP) . |
| 5-74963 | 3/1993 | (JP) . |
| 5-198523 | 8/1993 | (JP) . |
| 6-275229 | 9/1994 | (JP) . |
| 6-349950 | 12/1994 | (JP) . |
| 7-99195 | 4/1995 | (JP) . |
| 8-17770 | 1/1996 | (JP) . |
| 8-64561 | 3/1996 | (JP) . |

* cited by examiner

Primary Examiner—David Nelms
Assistant Examiner—David Nhu
(74) Attorney, Agent, or Firm—Sheridan Ross P.C.

(57) ABSTRACT

A semiconductor device and a process for producing the same. The device has two conducting layers that are spaced from each other and an insulating film for electrically insulating these two conducting layers from each other. The insulating film contains contact holes with plugs being embedded therein so as to electrically connect these two conducting layers by the plugs. The process contains a step of forming the insulating film on the lower conducting layer. An impurity having a kinetic energy is introduced into the insulating film. Next, contact holes are formed in the insulating film, and then plugs are formed in the contact holes. An upper conducting layer is formed on the insulating film so as to be electrically connected to the plugs.

7 Claims, 37 Drawing Sheets

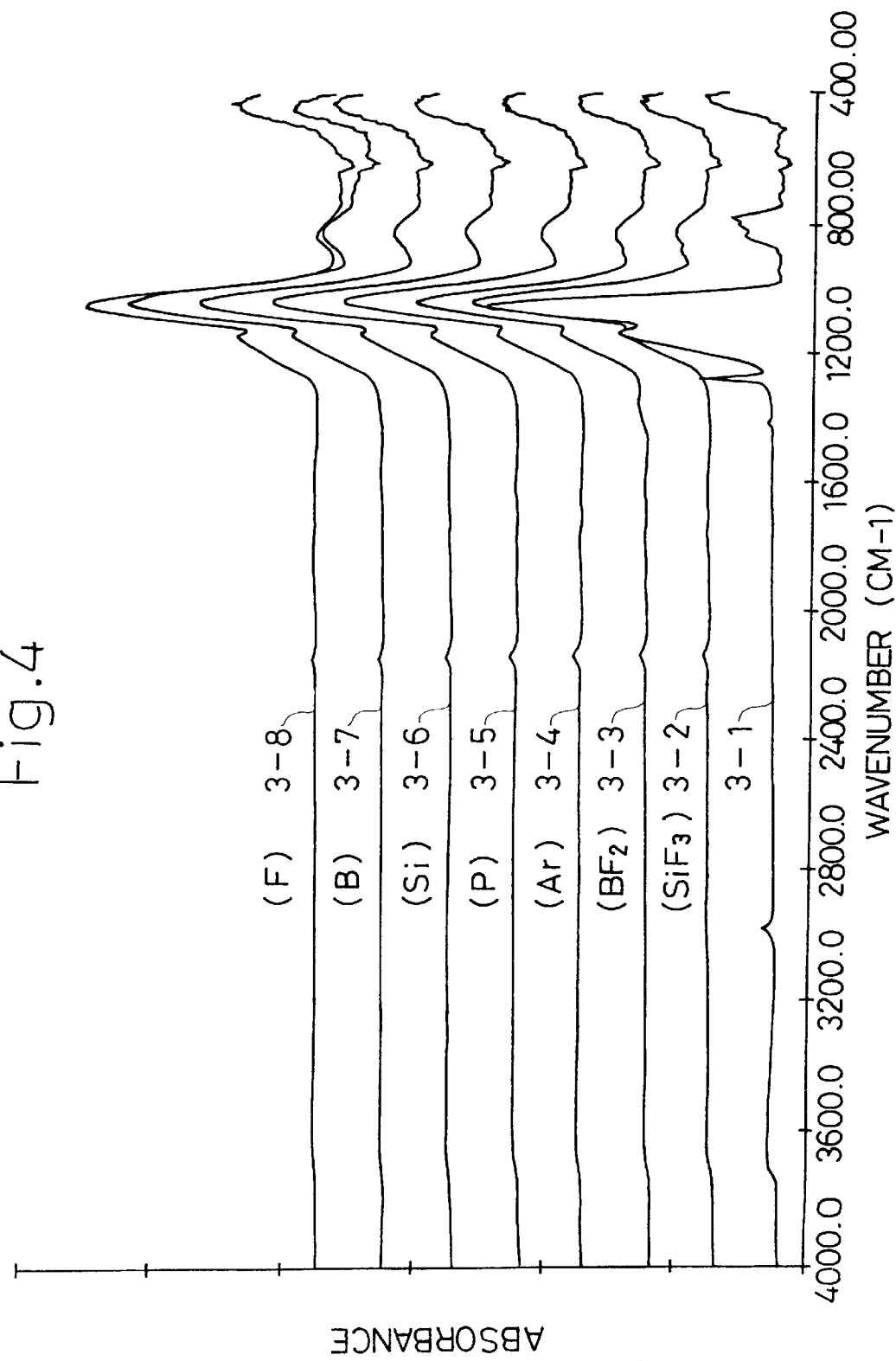

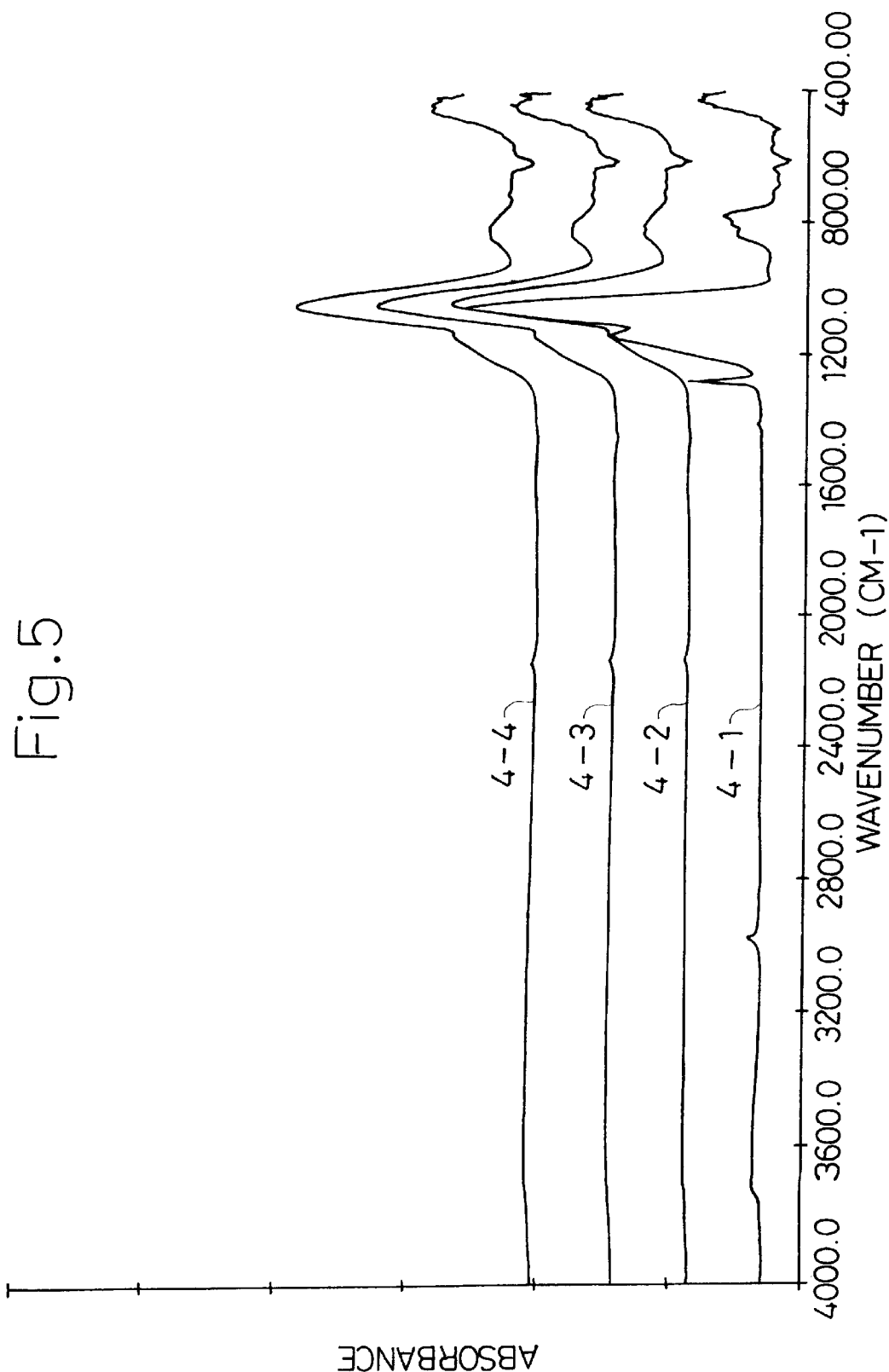

TDS spectra (m/e=2)

TDS spectra (m/e=15)

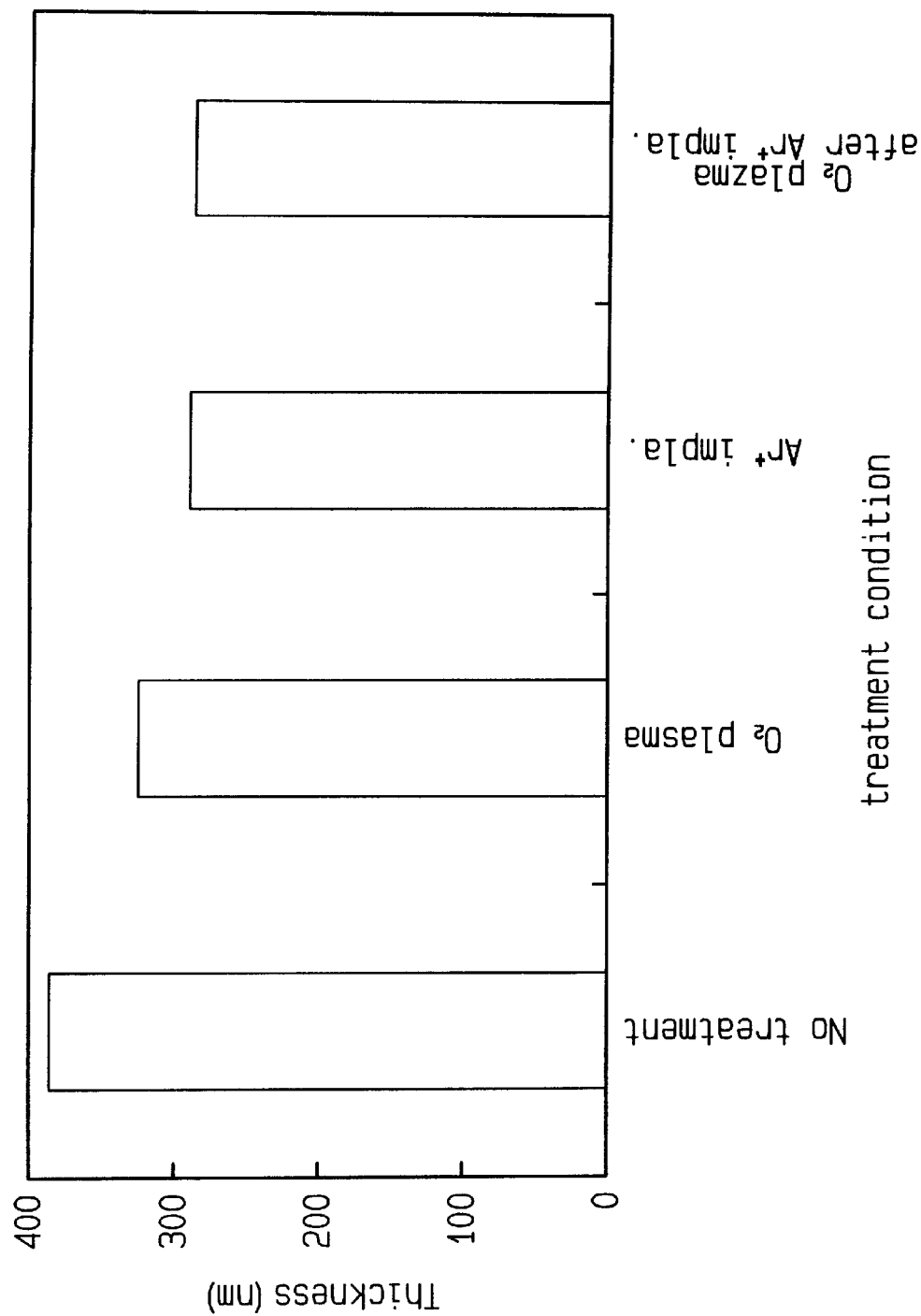

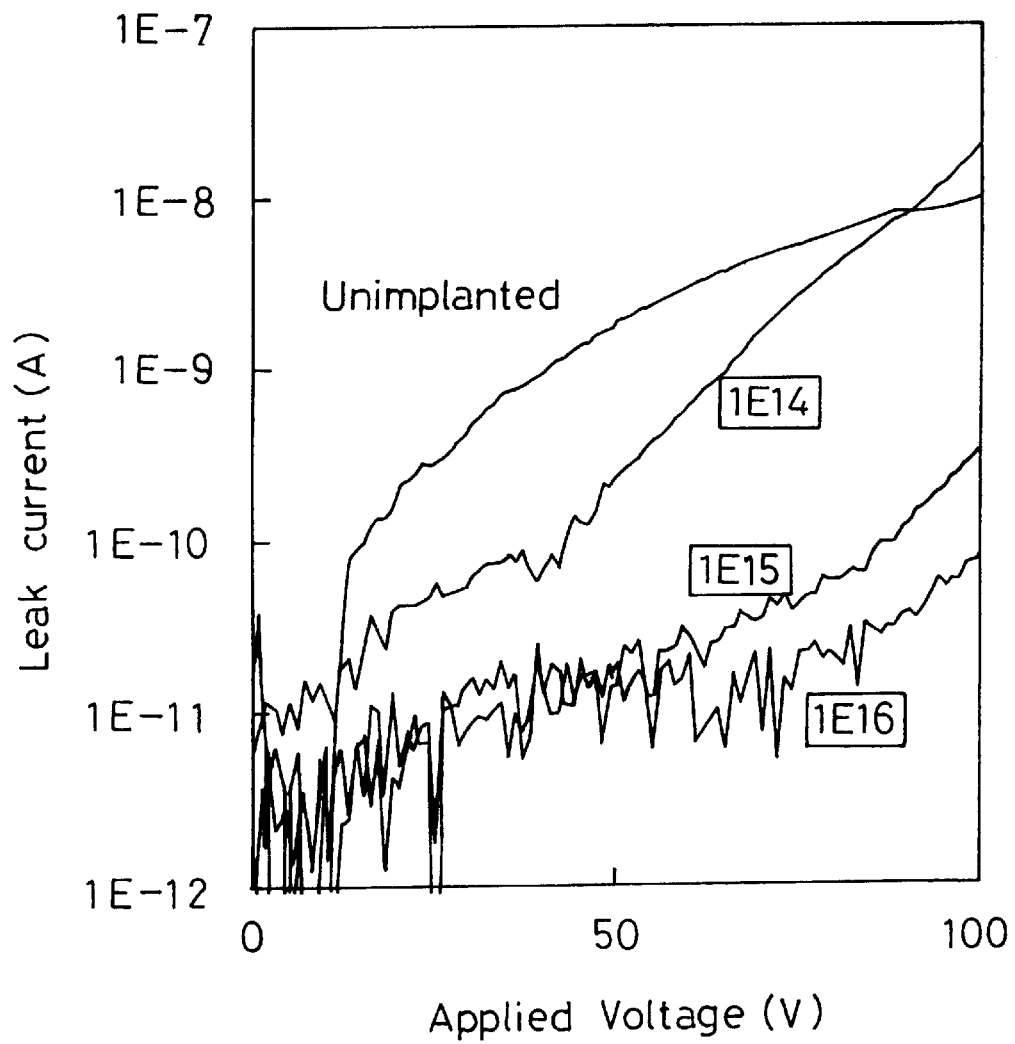

Ion implanted
( Ar⁺ 140keV
 1E15cm⁻² )

Annealed after implantation

500°C

600°C

PROCESS FOR PRODUCING SEMICONDUCTOR DEVICES INCLUDING AN INSULATING LAYER WITH AN IMPURITY

CROSS-REFERENCES TO RELATED APPLICATIONS

This application is a continuation in part application of U.S. patent application Ser. No. 08/528,123 filed on Sep. 14, 1995, now abandoned entitled "Process for Producing Semiconductor Devices and Semiconductor Devices Produced thereby." The Application is a division of Ser. No. 08/877,931 Jun. 18, 1997.

BACKGROUND OF THE INVENTION

1. Field of the Invention

The present invention relates generally to a semiconductor device and a process for producing the same. Particularly, the present invention relates to a technique for forming an interlayer insulating film between wirings or on a transistor.

2. Description of the Related Art

Recently, multilayered wirings employed in highly integrated semiconductor devices are required to have lower contact resistance between laminated wirings and more improved wiring reliability. Integration of semiconductor devices is still progressing. Accordingly, for example, in a wiring structure of the type where an insulating layer is located between a first wiring layer and a second wiring layer, contact holes (including via holes) to be formed in the insulating layer are required to have smaller diameters.

However, if the diameters of contact holes are reduced, it is difficult to deposit a wiring material in the contact holes with a sufficient thickness. Accordingly, it has been proposed to form plugs for connecting the first wiring layer and the second wiring layer by depositing a suitable metal such as tungsten, aluminum, nickel or copper in the contact holes by means of CVD (Chemical Vapor Deposition) method.

The blanket-tungsten CVD method among others can achieve efficient embedding of tungsten in the contact holes, and it is an important technique in forming multilayered wirings. According to the blanket-tungsten CVD method, tungsten is allowed to grow not only in the contact holes but also on the upper surface of the interlayer insulating film containing the contact holes, and then the tungsten present on the surface of the insulating film is etched back. This technique is disclosed, for example, in Japanese Unexamined Patent Publication No. Hei 4-307934.

In the conventional multilayered wiring forming technique, if the surface of the interlayer insulating film is not flat, steps are formed in the wirings formed on the insulating film, which may cause troubles such as disconnection. Accordingly, the surface of the interlayer insulating film should be as flat as possible so as to achieve planarization of the surface of the device. Such technique is referred to as a planarization technique and is becoming more and more important as the wirings are becoming finer and highly multilayered.

SOG (Spin-On-Glass) films are one type of interlayer insulating films that are most frequently employed in the planarization technique, and they are discussed particularly in a planarization technique utilizing flow characteristics of the interlayer insulating film material. SOG is a generic name for films that contain silicon dioxide as a major component and are formed from a solution of a silicon-containing compound in an organic solvent.

When an SOG film is to be formed, a solution of a silicon-containing compound in an organic solvent is first dropped onto the substrate, and then the substrate is rotated. Thus, a film of the solution is formed such that the steps formed on the substrate by the wiring are compensated for. That is, the solution collects in recesses. Thus, the surface of the film of the solution is planarized. Next, the thus treated substrate is subjected to thermal treatment to evaporate the organic solvent and promote a polymerization reaction of the silicon-containing compound, which results in an SOG film having a flat surface.

SOG films include inorganic SOG films, in which the silicon-containing compounds contain no organic component as represented by the general formula (1):

$$[SiO_2]_n \quad (1)$$

and organic SOG films, in which the silicon-containing compounds contain organic components as represented by the general formula (2):

$$[R_xSiO_y]_2 \quad (2)$$

wherein n, x and y are integers; and R represents an alkyl group or an aryl group.

The inorganic SOG film contains water and hydroxyl groups in large amounts and is brittle compared with a silicon oxide film formed by the CVD method. An SOG film having a film thickness of, for example, 0.5 µm or more readily cracks during thermal treatment.

Since the organic SOG film has a molecular structure containing a moiety terminated by an alkyl group or an aryl group, cracking which is liable to occur during thermal treatment can be controlled, so that the film thickness of the organic SOG film can be increased to about 0.5 to 1 µm. Accordingly, if an organic SOG film is used, not only can a thick interlayer insulating film be formed, but steps present on the substrate can fully be compensated for to give a planarized surface.

When an SOG film is employed as an interlayer insulating film, and if the insulating property and mechanical strength of the SOG film are important, an insulating film having high insulating property and high mechanical strength in addition to the property of blocking water and hydroxyl groups on or under the SOG film is usually used. However, even in such cases, as long as an SOG film containing water and hydroxyl groups is employed, the apprehension that such water and hydroxyl groups will have an adverse effect on various devices on the semiconductor substrate cannot be eliminated.

When a three-layer structure interlayer insulating film consisting of a silicon oxide film/SOG film/silicon oxide film is formed on an MOS (Metal Oxide Semiconductor) transistor, it has been confirmed by laboratory tests that water and hydroxyl groups contained in the SOG film adversely shorten the life of the MOS transistor even if the silicon oxide films are present.

Further, when an organic SOG film is employed as the interlayer insulating film and tungsten plugs are formed therein by the blanket-tungsten CVD method, formation of voids and cracking or film separation occurs, which leads to incompletely formed tungsten plugs in the contact holes. FIG. 29 shows a microscopic photograph of the cross section of such a tungsten plug formed in a contact hole observed cross sectionally by a SEM (Scanning Electron Microscope).

This photograph shows that the tungsten in the contact hole is incompletely formed. This is surmised to be caused by H$_2$O and CH$_3$ dissociated from the organic SOG film, which prevent the reactive gas for forming tungsten such as WF$_6$ from entering the contact holes sufficiently. It is another factor that recesses (see FIGS. 25 and 26) are formed on the plug in the contact hole. Recesses are formed by shrinkage of the organic SOG film when the organic components are removed from the organic SOG film.

Further, the organic SOG film also contains some water and hydroxyl groups, although small compared with the case of the inorganic SOG film. Such water and hydroxyl groups are likely to induce deterioration of electrical properties, corrosion and the like in the tungsten plugs.

SUMMARY OF THE INVENTION

The present invention relates to a semiconductor device and a process for producing the same, and it is an objective of the invention to prevent deterioration of device characteristics and obtain excellent flatness to be achieved by the insulating film.

In order to attain the intended objective described above, the semiconductor device according to the present invention has two conducting layers that are spaced from each other. An insulating film is electrically insulating these two conducting layers from each other. The insulating film contains a contact hole. A plug, which electrically connects these two conducting layers to each other, is embedded in the contact hole. The insulating film contains an impurity.

The semiconductor device is fabricated according to the following process. First, an insulating film is formed on a lower conducting layer. An impurity having a kinetic energy is introduced into the insulating film. Next, a contact hole is formed in the insulating film. A plug is formed in the contact hole. An upper conducting layer is formed on the insulating film so as to be electrically connected to the plug.

BRIEF DESCRIPTION OF THE DRAWINGS

The features of the present invention that are believed to be novel are set forth with particularity in the appended claims. The invention, together with the objects and advantages thereof, may best be understood by reference to the following description of the presently preferred embodiments taken in conjunction with the accompanying drawings in which:

FIGS. 4–11, 12(*a*), 12(*b*), 13, 14, 15, 16, 17(*a*), 17(*b*), 18(*a*), 18(*b*), 19, 20, 21(*a*), 21(*b*), 21(*c*), 22, 23 and 24 are graphs showing properties of various types of SOG films;

DETAILED DESCRIPTION OF THE PREFERRED EMBODIMENTS

A process for producing a semiconductor device according to a first embodiment of the invention will be described referring to FIGS. 1 to 3.

Figure 1A:
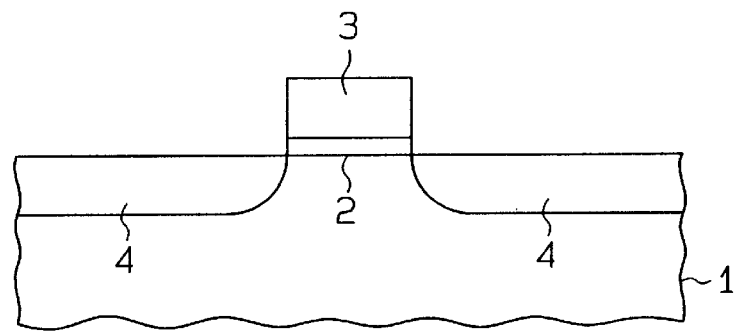
FIGS. 1(*a*), (*b*) and (*c*), FIGS. 2(*a*), (*b*) and (*c*) and FIGS. 3(*a*), (*b*) and (*c*) show schematically in cross-sectional view a process for producing a semiconductor device according to a first embodiment of the invention.
Figure 1B:
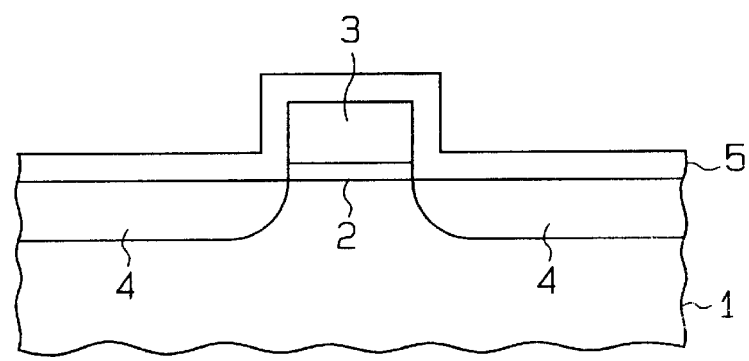
Figure 1C:
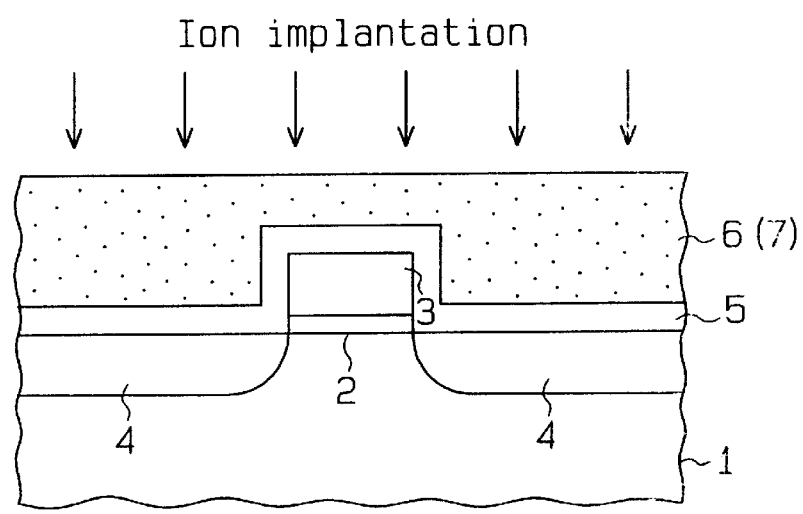

In Step 1 shown in FIG. 1(*a*), a gate insulating film 2 (film thickness: 10 nm) and a gate electrode 3 (film thickness: 200 nm) are formed on a (100) p-type (or n-type) single crystal silicon substrate 1. Then, the substrate 1 is doped with an n-type (or p-type) impurity by means of ion implantation utilizing the gate insulating film 2 and gate electrode 3 as a mask to form source and drain regions 4 in self alignment to complete an MOS transistor.

Next, in Step 2 shown in FIG. 1(*b*), a silicon oxide film 5 (film thickness: 500 nm) is formed over the entire surface of the device by means of plasma CVD method. The gas to be employed in this plasma CVD method is a mixed gas of, for example, monosilane and nitrogen suboxide (SiH$_4$+N$_2$O), monosilane and oxygen (SiH$_4$+O$_2$), or TEOS (tetra-ethoxy-silane) and oxygen (TEOS+O$_2$). The silicon oxide film 5 is formed at a temperature of 300 to 900° C.

In Step 3 shown in FIG. 1(*c*), an organic SOG film 6 is formed on the silicon oxide film 5. The silicon-containing compound of the organic SOG film 6 has a composition of [CH$_3$Si(OH)$_3$] and a film thickness of 400 nm. Referring to the method of forming the film 6, a solution of the silicon-containing compound in an alcoholic solvent (e.g., IPA (isopropyl alcohol)+acetone) is first dropped onto a substrate 1, and then the substrate is rotated at 5400 rpm for 20 seconds to form a film of the solution on the substrate 1. In this process, the film is formed to compensate for steps present on the substrate. That is, the solution is applied thick in recesses of the substrate 1 and thin at protrusions thereof. Thus, the surface of the alcoholic solution film is planarized.

Next, the thus treated substrate is heat-treated successively at 100° C. for one minute, at 200° C. for one minute, at 300° C. for one minute, at 22° C. for one minute and at 300° C. for 30 minutes in a nitrogen atmosphere, whereby to evaporate the alcoholic solvent and also to promote a polymerization reaction of the silicon-containing compound, forming an organic SOG film 6 having a flat surface. The organic SOG film 6 is an organic insulating film that contains over 1% carbon.

The organic SOG film 6 is then doped with argon ions (Ar$^+$) by means of ion implantation to achieve decomposition of the organic components, as well as, reduction of the water and hydroxyl groups contained in the film. The doping treatment is carried out with an acceleration energy of 140 keV and a dose of 1×10$^{15}$ ions/cm$^2$. As a result, the organic SOG film 6 is converted to an SOG film (hereinafter referred to as a modified SOG film) 7 containing only small amounts of water and hydroxyl groups but no organic component. It should be noted here that the argon ions correspond to the impurity having a kinetic energy.

Figure 2A:
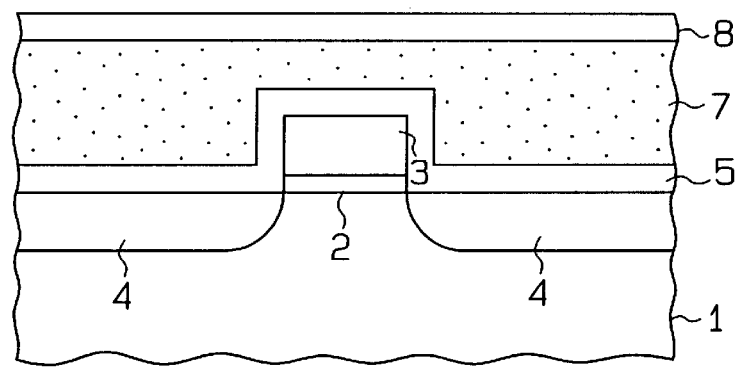
Figure 2B:
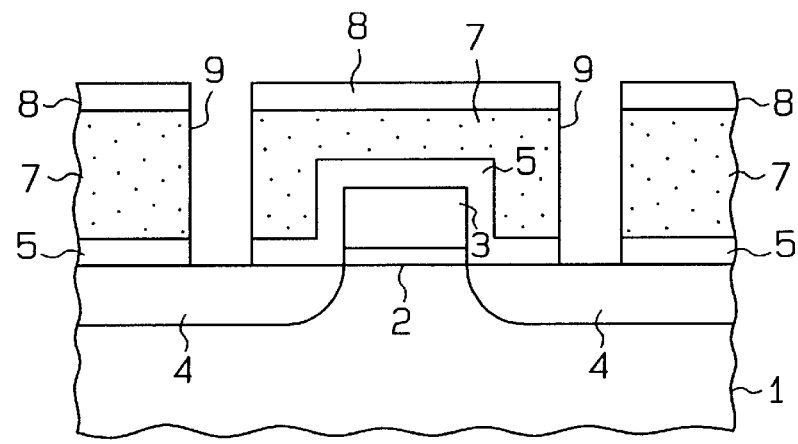
Figure 2C:
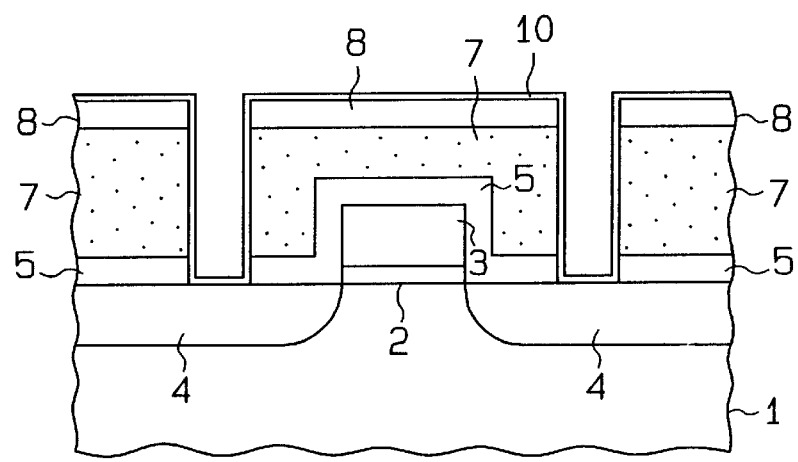

In Step 4 shown in FIG. 2(*a*), a silicon oxide film 8 (film thickness: 200 nm) is formed on the modified SOG film 7 by means of plasma CVD method. The silicon oxide film 8 is formed under the same conditions as the silicon oxide film 5 is formed. In Step 5 shown in FIG. 2(*b*), via holes 9 are formed through the films 5, 7 and 8 present on the source/drain regions 4 by anisotropic etching employing a mixed gas of carbon tetrafluoride and hydrogen as an etching gas. In Step 6 shown in FIG. 2(*c*), a titanium nitride thin film 10 is formed on the silicon oxide film 8 and also in the via holes 9 by means of magnetron sputtering.

Figure 3A:
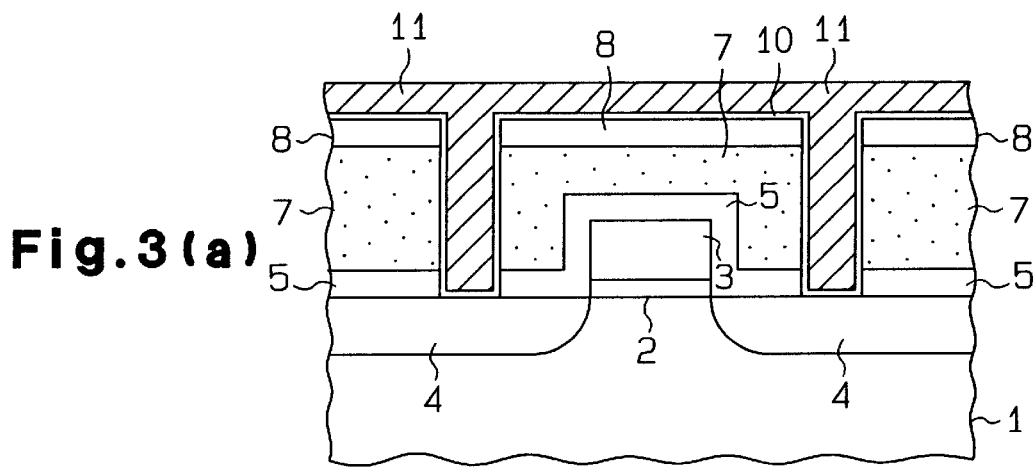

In Step 7 shown in FIG. 3(*a*), the via holes 9 are cleaned by sputter etching employing an inert gas (e.g. Ar).

Subsequently, a tungsten layer 11 is formed on the titanium nitride thin film 10 including the bores of the via holes 9 by means of blanket-tungsten CVD. The tungsten layer 11 is suitably formed under the following conditions: temperature: 450° C.; pressure: 90 Torr; gas employed: tungsten hexafluoride ($WF_6$; flow rate 70 sccm)+hydrogen ($H_2$; flow rate 420 sccm), (gas flow rate ratio: $H_2/WF_6=6$). The temperature and the gas flow rate ratio ($H_2/WF_6$) can be suitably adjusted within the range of 425 to 475° C. and within the range of 5 to 70, respectively.

Figure 3B:
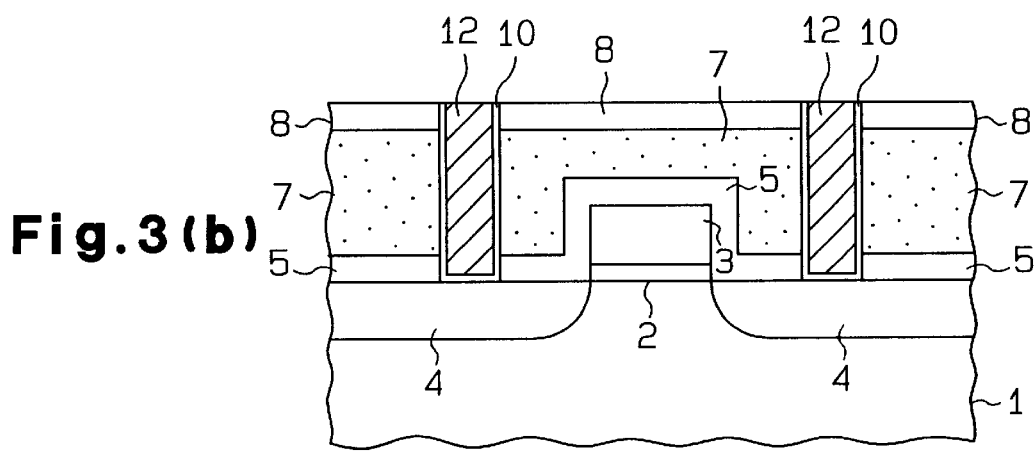
Figure 3C:
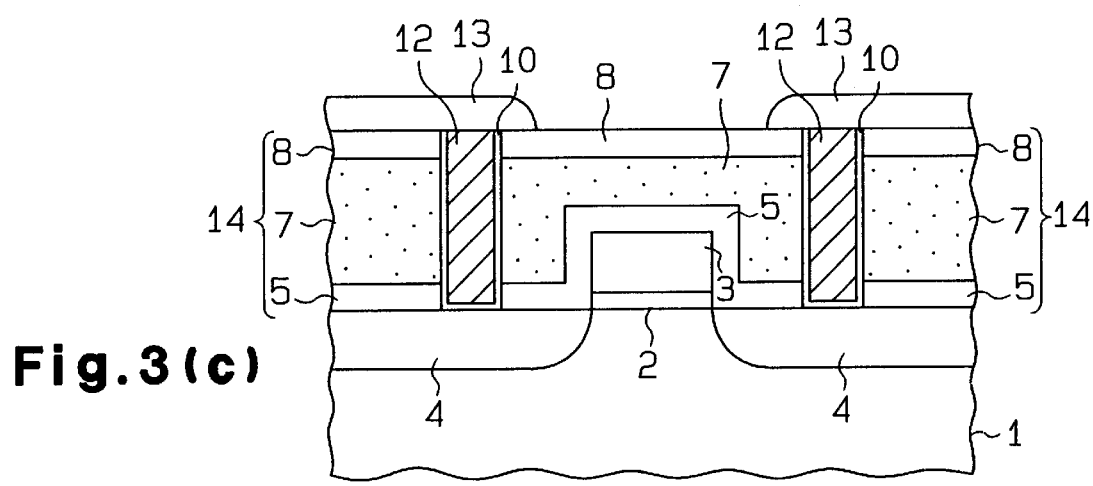

Then, in Step 8 shown in FIG. 3(b), the titanium nitride thin film 10 and the tungsten layer 11 are totally etched back anisotropically until the silicon oxide film 8 is exposed such that the tungsten 11 and the silicon oxide film 8 may be present substantially on the same plane. Thus, tungsten plugs 12 are formed in the via holes 9. Such tungsten plugs 12 form together with the titanium nitride thin film 10 remaining in the via holes 9 source and drain electrodes. In Step 9 shown in FIG. 3(c), the oxide films present on the surfaces of the tungsten plugs 12 are, as necessary, removed by sputter etching employing an inert gas (e.g., Ar).

Next, an aluminum alloy film (Al—Si (1%)-Cu (0.5%)) (film thickness: 500 nm), a Ti film (film thickness: 50 nm) and a TiN film (film thickness: 20 nm) are successively formed on the tungsten plugs 12 and the silicon oxide film 8 by means of magnetron sputtering. Finally, the aluminum alloy film, the Ti film and the TiN film are subjected to patterning by undergoing procedures of resist application (not shown), light exposure and etching according to the ordinary lithographic technique and dry etching technique (RIE, etc.) to form an upper metal wiring 13 having a desired pattern.

As described above, in this embodiment, an interlayer insulating film 14 having a three-layered structure consisting of a silicon oxide film 5, a modified SOG film 7 and a silicon oxide film 8 is formed on an MOS transistor. The modified SOG film 7 is formed by means of doping ions to the organic SOG film 6 so that the thickness of the organic SOG film 6 is maintained unchanged in the modified SOG film 7. Since the organic SOG film 6 can have increased thickness such as 0.5 to 1.0 μm and the thickness is unchanged during forming the modified SOG film 7, the SOG film 7 can be allowed to have an increased film thickness of 0.5 to 1 μm.

Accordingly, even if great steps are present on the substrate 1, such steps can be compensated for by the modified SOG film 7 and can give a semiconductor device having a sufficiently planarized surface.

A sandwich structure consisting of a modified SOG film 7 sandwiched between silicon oxide films 5 and 8 is employed in this embodiment. This structure enhances insulating property and mechanical strength of the interlayer insulating film 14 as a whole. The silicon oxide film 5 is formed so as to eliminate influence of the water and hydroxyl groups contained in small amounts in the modified SOG film on the MOS transistor. The presence of the silicon oxide film 8 prevents the modified SOG film 7 from absorbing water in the atmosphere.

Since the modified SOG film 7 contains no organic component, the etching treatment for forming via holes 9 can be carried out in a mixed gaseous atmosphere of carbon tetrafluoride and hydrogen. Accordingly, if a photoresist is employed as an etching mask in this etching treatment, the photoresist remains intact, so that the modified SOG film 7 masked by the photoresist also remains unetched. Thus, fine via holes 9 can be formed accurately.

Since the modified SOG film 7 contains no organic component, the modified SOG film 7 and the silicon oxide films 5 and 8 can be etched at the same rate. It does not happen that the modified SOG film 7 shrinks during the ashing treatment for removing the photoresist used as the etching mask. Accordingly, the modified SOG film 7 does not undergo cracking, and further no recess is formed when via holes 9 are formed. This enables embedding of tungsten 11 sufficiently in the via holes 9 to maintain excellent contact between the source and drain electrodes with the source and drain regions 4.

The modified SOG film 7 contains very small amounts of water and hydroxyl groups and no organic component. Accordingly, both or one of the silicon oxide films 5 and 8 may be omitted to employ the modified SOG film 7 as a single layer or double layer.

The structure and various properties of the modified SOG film 7 were examined, and the results will be described below. The structure of the modified SOG film 7 was evaluated by means of FT-IR method (Fourier Transform Infrared Spectroscopy), TDS method (Thermal Desorption Spectroscopy) and was discussed together with evaluation results of plasma resistance, heat resistance and hygroscopicity. Electrical properties of the modified SOG film 7 were evaluated by means of high-frequency CV (Capacitance Voltage) for an MOS capacitor fabricated employing aluminum electrodes.

Stability of the film was evaluated by putting foci on heat resistance, plasma resistance, water permeability and hygroscopicity. Heat resistance was evaluated putting a focus on change in the film thickness by measuring the film thickness before and after the thermal treatment in an nitrogen atmosphere. Plasma resistance was evaluated putting a focus on changes in the film thickness and in the IR absorption spectrum by measuring the film thickness and spectrum before and after plasma exposure (employed for resist ashing). Hygroscopicity and water permeability were evaluated putting foci on changes in the IR absorption spectrum by measuring it before and after leaving to stand in a clean room and before and after a pressure cooker test (PCT). Further, the gas released from the film 7 was analyzed by means of TDS and was discussed in comparison with the change in the IR absorption spectrum (FT-IR spectrum) measured by FT-IR method.

The film thickness values of the SOG films 6 and 7 were evaluated by means of cross-sectional SEM. Electrical properties of the SOG films 6 and 7 were evaluated, for MOS capacitors fabricated employing (100) n-type single crystal silicon substrate and aluminum electrodes formed thereon, by means of high-frequency CV method (frequency: 1 MHZ). The MOS capacitors employed here were subjected to thermal treatment at 450° C. for 15 minutes in a foaming gas ($H_2/N_2=1/9$) after formation of the electrodes.

A. Change in the Structure of Modified SOG Film 7

A-1. Chemical Bonds in Modified SOG Film 7 (FT-IR Method)

IR absorption spectra of the organic SOG films 6 were measured by means of FT-IR immediately after implantation of various ions, and the results are shown in FIG. 4. The ion implantation was carried out with an acceleration energy of 140 keV and at a dose of $1\times10^{16}$ atoms/$cm^2$, followed by thermal treatment at 300° C. for 30 minutes. The same results can be obtained even when the thermal treatment after the ion implantation is omitted.

The graphs 3-1, 3-2, 3-3, 3-4, 3-5, 3-6, 3-7 and 3-8 in FIG. 4 are IR absorption spectra of the SOG films 6 at the following time points:

Graph 3-1: immediately after formation of the organic SOG film 6 (before ion implantation);

Graph 3-2: immediately after implantation of silicon fluoride ($SiF_3$) ion;

Graph 3-3: immediately after implantation of boron fluoride ($BF_2$) ion;

Graph 3-4: immediately after implantation of argon ion;

Graph 3-5: immediately after implantation of phosphorus ion;

Graph 3-6: immediately after implantation of silicon ion;

Graph 3-7: immediately after implantation of boron ion; and

Graph 3-8: immediately after implantation of fluorine ion.

As the graph 3-1 shows, absorption peaks attributed to the organic components appeared at wave numbers of around 3000 $cm^{-1}$ and 1250 $cm^{-1}$ before the ion implantation. The absorption peak around 3000 $cm^{-1}$ is caused by the C—H bond stretching vibration; whereas the absorption peak around 1250 $cm^{-1}$ is caused by the C—H bond deformation vibration.

However, as the graphs 3-2 to 3-8 show, no absorption peak appeared around 3000 $cm^{-1}$ and 1250 $cm^{-1}$ after the ion implantation. Further, as the graphs 3-2 to 3-8 show, it can be understood that the IR absorption spectrum of the modified SOG film 7 did not change depending on the ionic species implanted. Accordingly, it can be understood that the organic components contained in the organic SOG film 6 were decomposed by the ion implantation.

It should be noted that if water and hydroxyl groups are contained in the modified SOG film 7, absorption peaks attributed to the hydroxyl group should have appeared around 3600 $cm^{-1}$ and 930 $cm^{-1}$. The absorption peak around 3600 $cm^{-1}$ of these two peaks is caused by the O—H bond stretching in H—OH and Si—OH. However, no such absorption peaks appeared in the graphs 3-2 to 3-8. Accordingly, it can be understood that the water and hydroxyl groups contained in the modified SOG film 7 were reduced immediately after the ion implantation compared with the organic SOG film 6.

IR absorption spectra of the organic SOG film 6 measured by means of FT-IR before and after the ion implantation are shown in FIG. 5. The ion implantation was carried out under the same conditions and employing the same ionic species as in the case shown in FIG. 4. The IR absorption spectrum of the modified SOG film 7 did not change even if the ionic species was changed.

The graphs 4-1, 4-2, 4-3 and 4-4 in FIG. 5 are IR absorption spectra of the modified SOG film 7 measured at the following time points:

4-1: immediately after formation of the organic SOG film 6;

4-2: immediately after ion implantation;

4-3: after one-day exposure under atmospheric condition in a clean room from the ion implantation; and 4-4: after 10-day exposure under atmospheric condition in a clean room from the ion implantation.

As the graphs 4-2 to 4-4 show, the absorption peaks around 3600 $cm^{-1}$ and 930 $cm^{-1}$ were not substantially increased with time after the ion implantation. Accordingly, it can be understood that the water and hydroxyl groups contained in the modified SOG film 7 did not increase with time.

Figure 6:
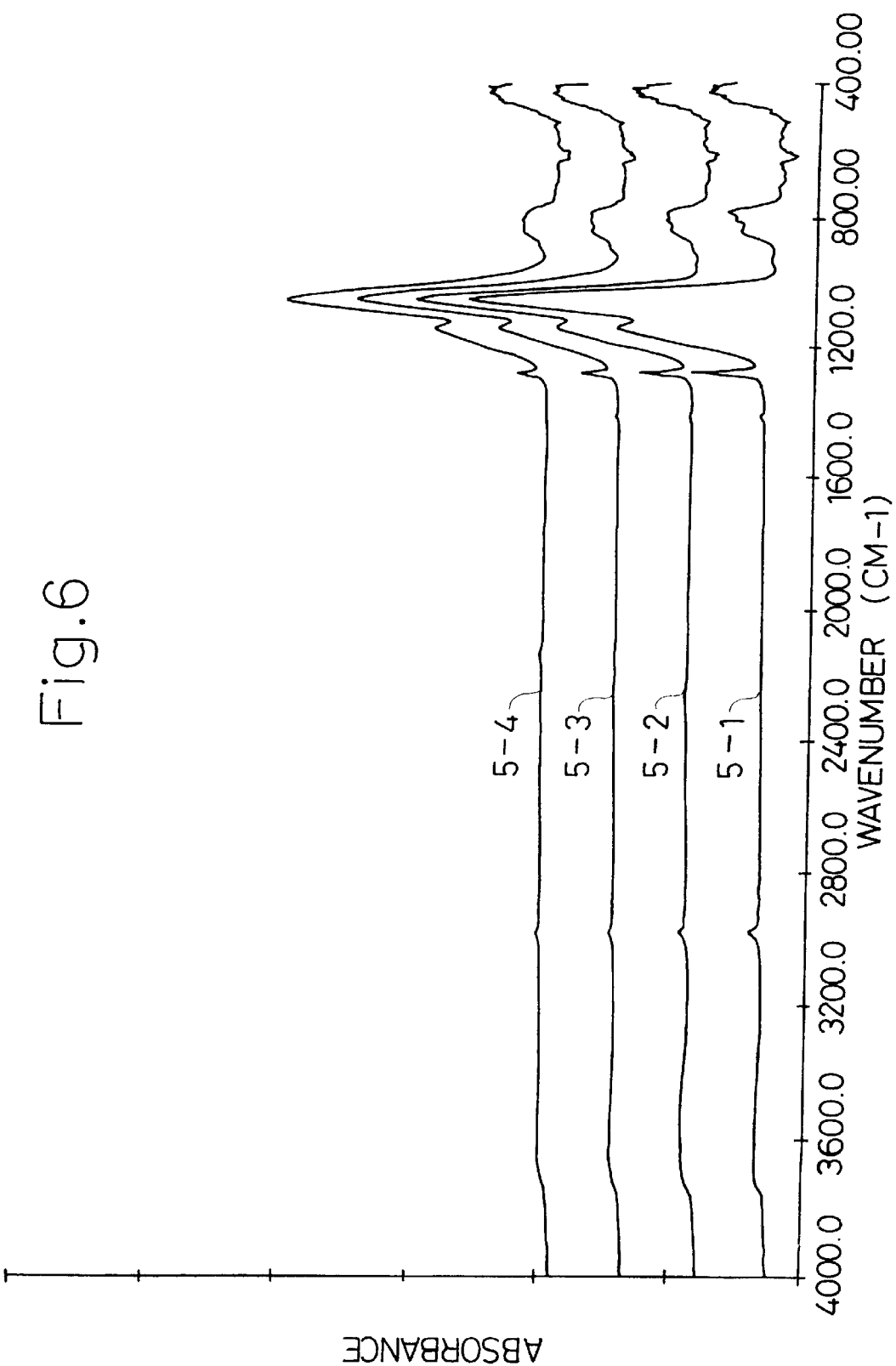
Figure 7:
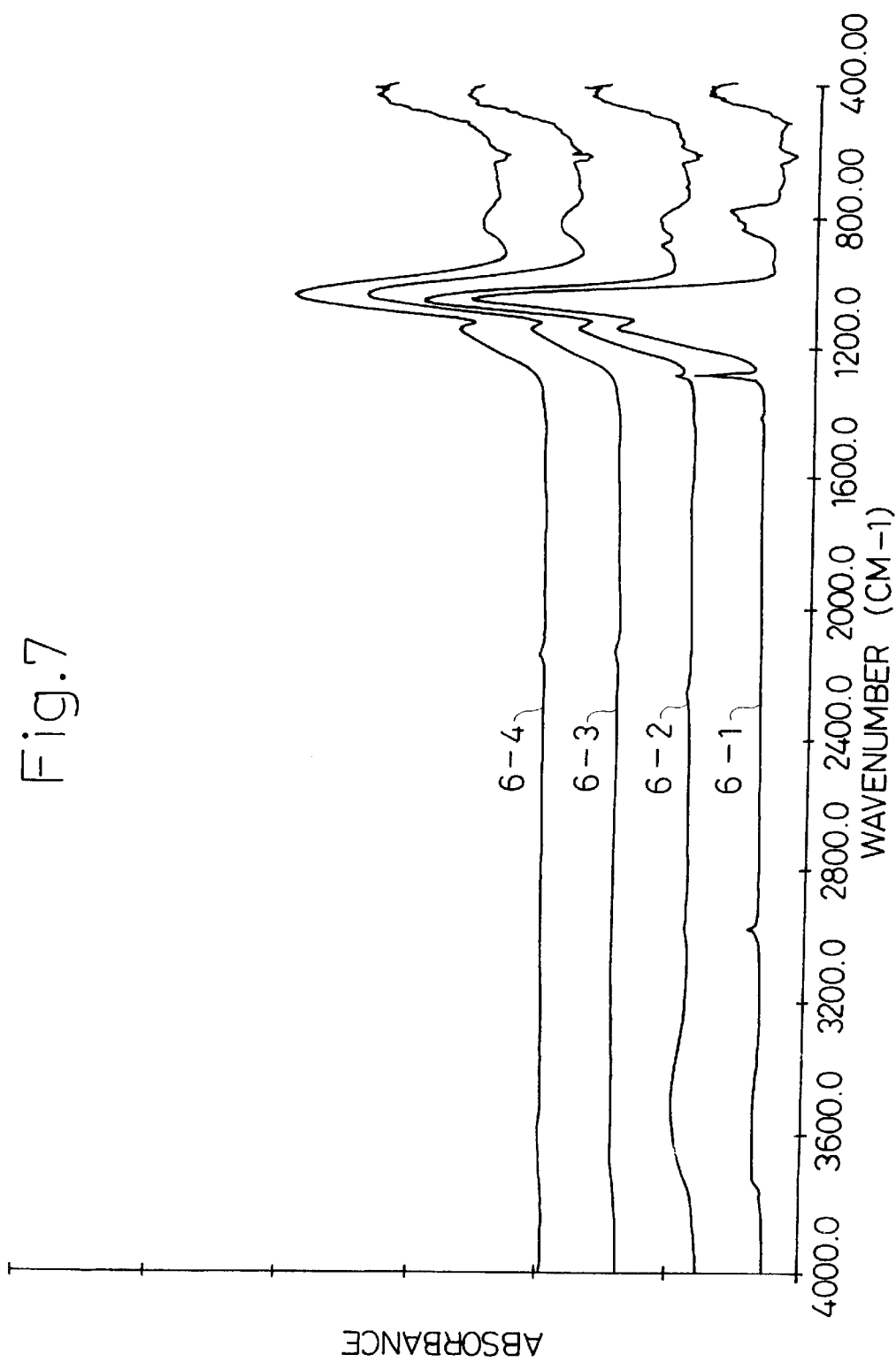

IR absorption spectra when the dose of ion to be implanted to the organic SOG film 6 was changed were measured by means of FT-IR, and the results are shown in FIGS. 6 and 7. Incidentally, the ion implantation was carried out under the following conditions: acceleration energy: 30 keV in the case of FIG. 6; whereas 140 keV in the case of FIG. 7. In both cases thermal treatment was carried out after the ion implantation at 300° C. for 30 minutes. The same results were obtained even if the thermal treatment after the ion implantation was omitted. Further, the same ionic species as in the case shown in FIG. 4 were implanted.

The graphs shown in FIGS. 6 and 7 are IR absorption spectra of the organic SOG film 6 measured under the following conditions:

5-1 and 6-1: immediately after formation of the organic SOG film 6;

5-2 and 6-2: dose: $1\times10^{14}$ atoms/$cm^2$;

5-3 and 6-3: dose: $1\times10^{15}$ atoms/$cm^2$; and 5-4 and 6-4: dose: $1\times10^{16}$ atoms/$cm^2$.

As the graphs 5-1 to 6-4 show, the higher the ion dose, the smaller the gentle absorption peak around 3600 $cm^{-1}$ and the somewhat steep absorption peak around 930 $cm^{-1}$. Accordingly, it can be understood that the water and hydroxyl groups contained in the modified SOG film 7 are reduced by increasing the dose of ion to be implanted. It should be noted that, in the case where the dose is $1\times10^{14}$ atoms/$cm^2$, the amount of water and that of hydroxyl groups contained in the film are greater than in the organic SOG film 6 immediately after formation. However, the percentage of increase is very small.

As described above, since the water and hydroxyl groups contained in the organic SOG film 6 are not substantially increased depending on the ion dose according to the embodiment of the present invention, defectives such as poisoned via in the via holes 9 can be prevented from occurring without providing the extra step of etching back the organic SOG film 6.

Figure 8:
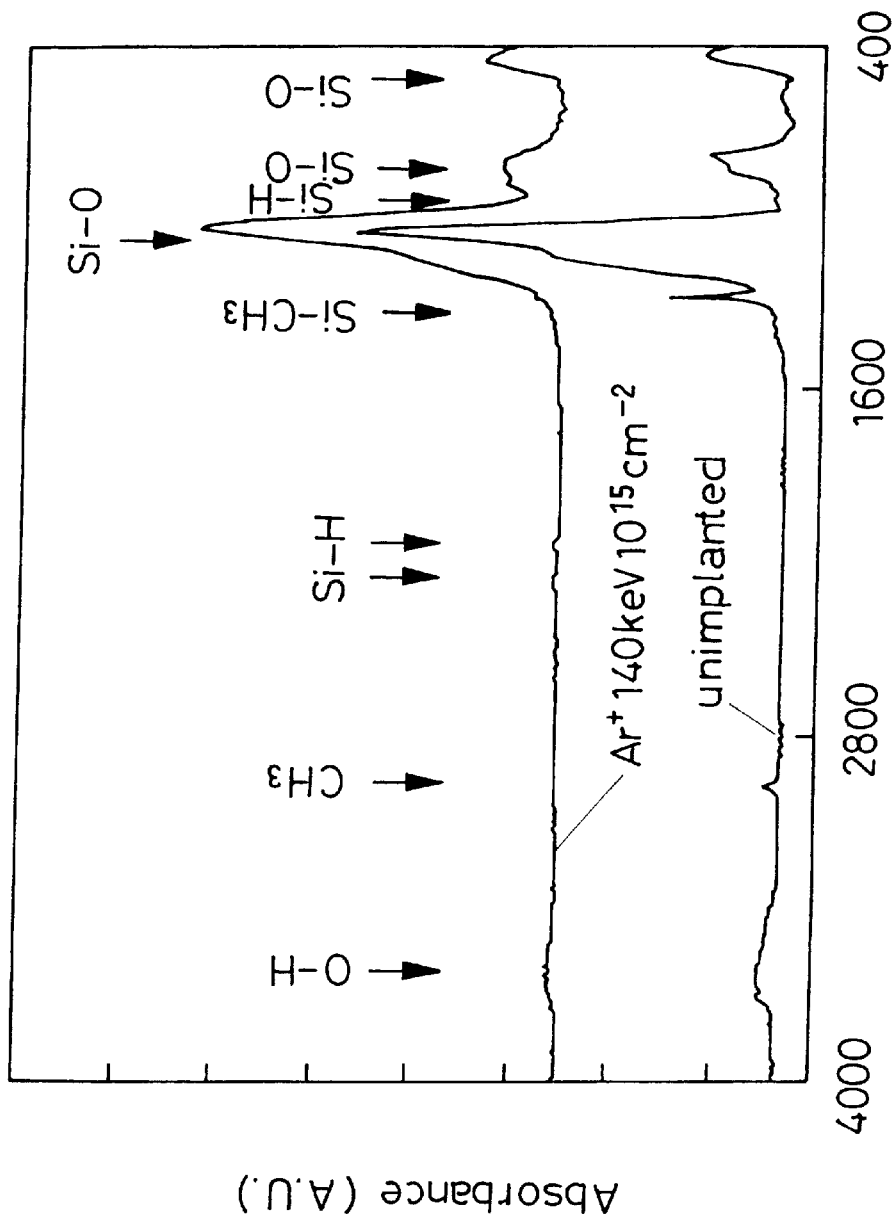

FIG. 8 shows results of IR absorption spectrum measurement carried out by means of FT-IR method immediately after argon ion implantation to the organic SOG film 6. The ion implantation was carried out under the following conditions:

acceleration energy: 140 keV; dose: $1\times10^{15}$ atoms/$cm^2$.

In the modified SOG film 7, no absorption peaks attributed to —$CH_3$ (around 3000 $cm^{-1}$) and Si—$CH_3$ (around 1250 $cm^{-1}$) appeared. This suggests that the organic components in the organic SOG film 6 have been decomposed. Further, it can be also understood that there is no substantial change in the absorption intensity levels of O—H (around 3500 $cm^{-1}$) and Si—O (around 1100 $cm^{-1}$) measured before and after the ion implantation.

Since argon is an inert element, it can be considered that the ion implantation impact energy brought about the above result. Further, as shown in FIG. 4, the similar results were obtained when other ions were employed, and this suggests that the above result is brought about by the nondependency on the ionic species.

B. Stability of Modified SOG Film 7

B-1. Heat Resistance

Figure 9:
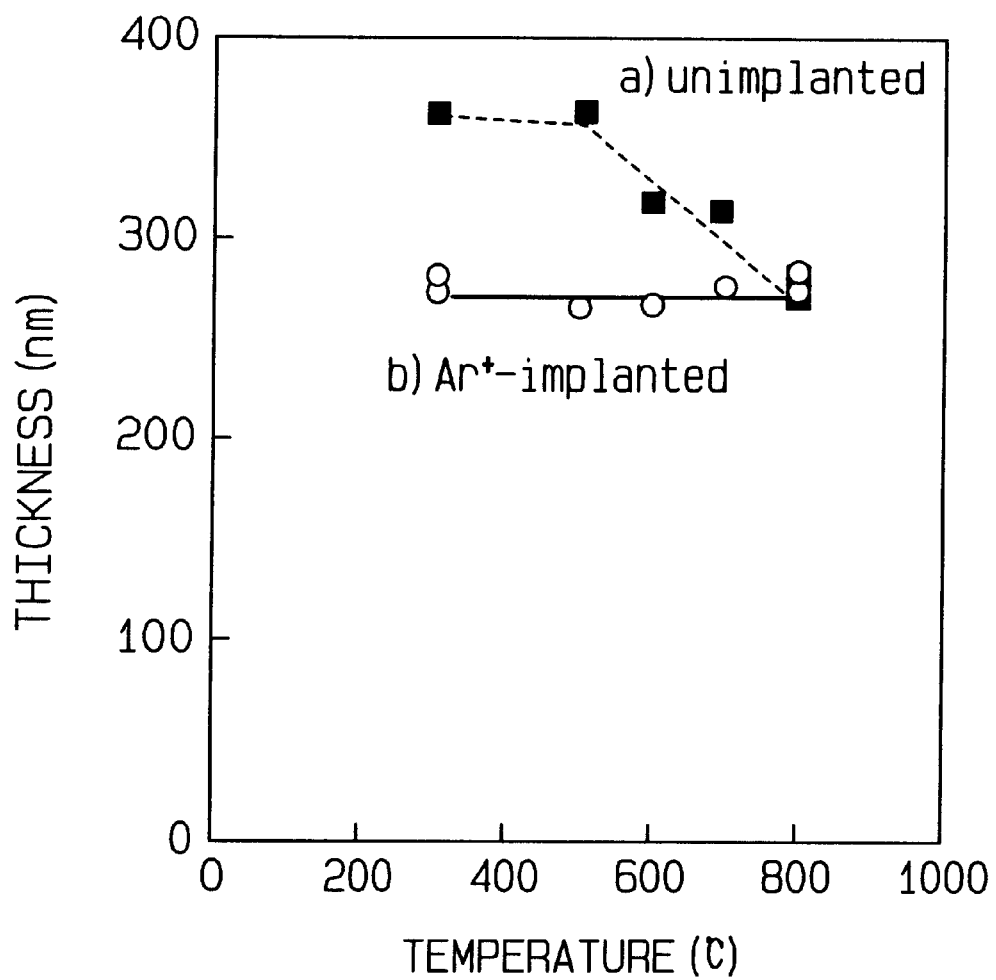

As an index of heat resistance, loss in the thickness of the modified SOG film 7 was evaluated. Change in the film thickness when the modified SOG film 7 obtained by subjecting the organic SOG film 6 to $Ar^-$ implantation was heat-treated in a nitrogen atmosphere for 30 minutes is shown in FIG. 9. The ion implantation was carried out under the following conditions: acceleration energy: 140 keV; dose: $1\times10^{15}$ atoms/$cm^2$.

When the organic SOG film 6 was heat-treated, the film thickness was reduced with the rise in the thermal treatment temperature (see graph (a) in FIG. 8). Such loss in the film thickness is supposed to be due to densification of the film that occurred with the rise in the thermal treatment temperature. The film thickness of the modified SOG film 7 was not reduced even if it was heat-treated at 800° C. (see graph (b)

in FIG. 8). The thickness of the modified SOG film 7 is substantially the same as that of the organic SOG film 6 heat-treated at 800° C. This shows that the modified SOG film 7 is densified to the same level as achieved when the organic SOG film 6 is heat-treated at 800° C.

B-2. Residual Stress

Figure 10:
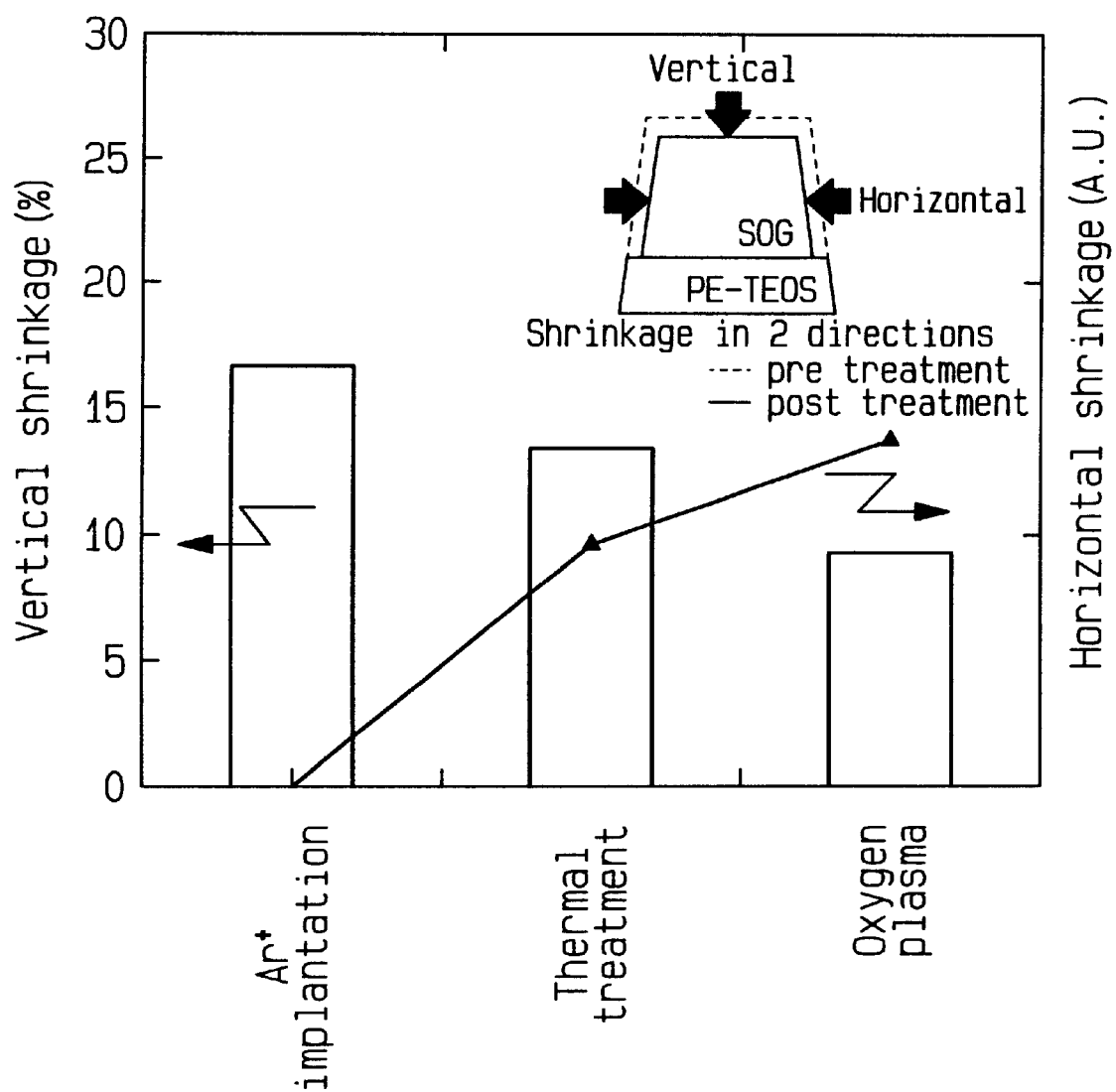

FIG. 10 shows results of measurement of shrinkage percentages of the organic SOG film 6 in the horizontal direction and in the vertical direction of the film 6 when the film 6 was treated according to the following three modes.

i) When a modified SOG film is formed by argon ion implantation after processing of the organic SOG film 6 into fine linear forms ($Ar^+$ implantation);

ii) When thermal treatment was applied in a nitrogen atmosphere for 30 minutes (Thermal treatment); and iii) When the film 6 was exposed to oxygen plasma (Oxygen plasma).

It can be understood that horizontal shrinkage and vertical shrinkage occurred in the thermal treatment and in the oxygen plasma treatment. Meanwhile, it can be understood that vertical shrinkage (in the direction of thickness) occurs but no horizontal shrinkage (in the direction of width) in case of ion implantation. These results show that the implantation of ions into the organic SOG film 6 achieves densification of the film but there remains no substantial stress in the film. When the residual stress was actually measured, it showed a low value of about $-4 \times 10^8$ dyne/$cm^2$. The residual stress, for example, in the case of a silicon oxide film formed by means of plasma CVD method employing TEOS and oxygen and then subjected to ion implantation, is about $-2 \times 10^9$ dyne/$cm^2$. Further, neither cracking nor film separation occurred even when the organic SOG film 6 was modified all at once to a depth of about 600 nm.

B-3. Heat Eliminable Gas Characteristics

Figure 11:
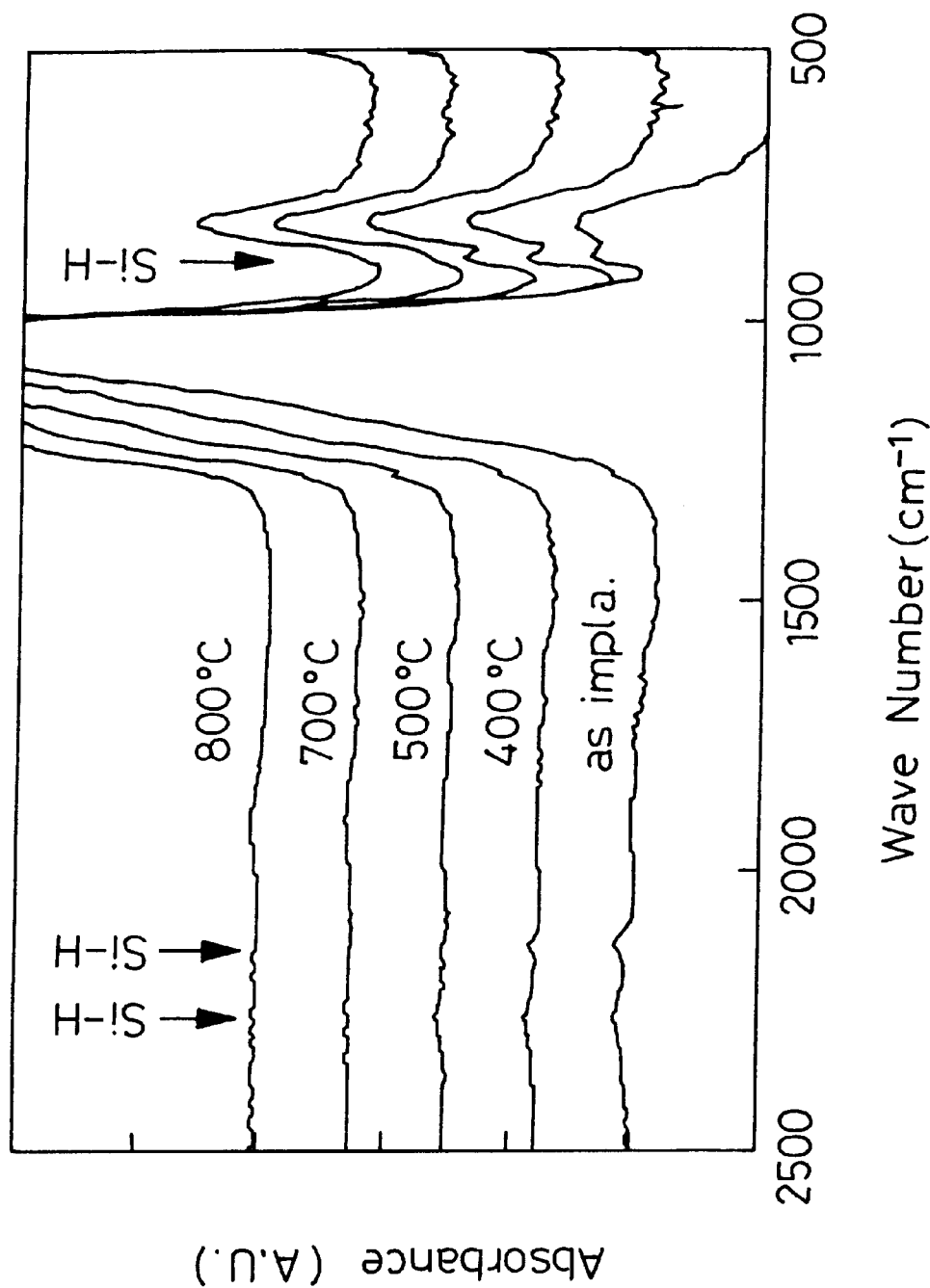

The modified SOG film 7 obtained by subjecting the organic SOG film 6 to $Ar^-$ implantation was subjected to thermal treatment in a nitrogen atmosphere for 30 minutes and evaluated by means of FT-IR, and the results are shown in FIG. 11. It can be understood that, in the thermal treatments at 400° C. or higher, the absorption peaks (around 900 $cm^{-1}$ and 2100 to 2300 $cm^{-1}$) which are supposed to be attributable to the Si—H bond are reduced gradually with the temperature rise.

Figure 12A:
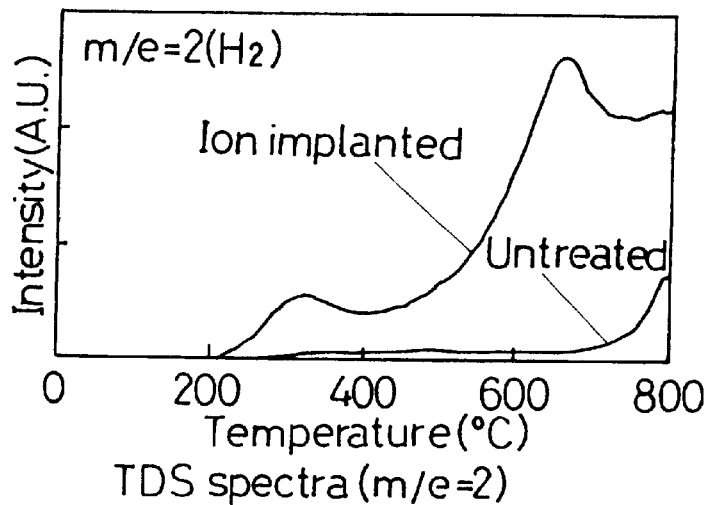
Figure 12B:
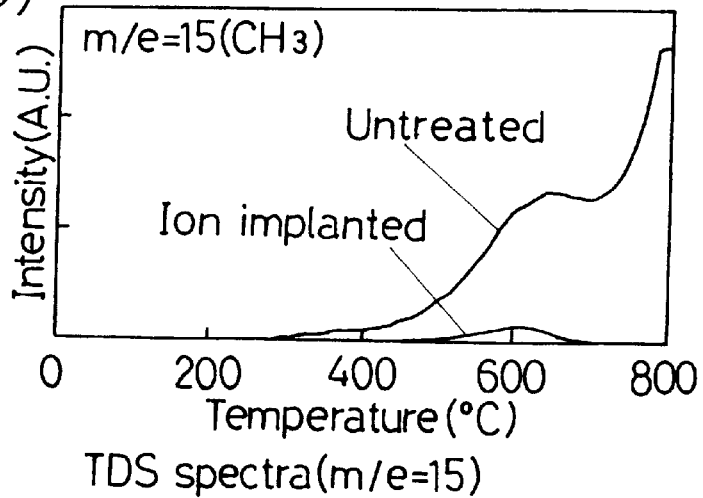

The modified SOG film 7 was heat-treated in a nitrogen atmosphere for 30 minutes and evaluated by means of TDS, and the results are as shown in FIGS. 12(a) and 12(b). The ion implantation was carried out under the following conditions: dose: $1 \times 10^{15}$ atoms/$cm^2$; acceleration energy: 140 keV.

In the thermal treatments at 400° C. or higher, dissociation of hydrogen was observed as shown in the graph of FIG. 12(a). The observation results coincide with the behaviors of the absorption peak that is supposed to be attributable to the Si—H bond observed by the FT-IR method. Accordingly, the hydrogen dissociated from the Si—H bond seems to have been observed again by the TDS analysis.

It is considered that the hydrogen atoms dissociated by the ionic impact concern much in the process that the Si—H bond is formed by the ion implantation. Such hydrogen atoms include (1) those dissociated from the carbon atoms constituting the methyl groups and (2) those dissociated from the Si—OH bond or $H_2O$. Accordingly, it can be considered that the silicon dangling bonds formed by dissociation of oxygen and carbon are terminated by the hydrogen atoms (1) or (2).

Further, when the modified SOG film 7 was compared with the organic SOG film 6 by means of TDS, m/e relative strength values in the modified SOG film 7 are: $H_2$ (m/e=2) 13; $CH_3$ (m/e=15) 0.1; $H_2O$ (m/e=28) 2.4; $CO_2$ (m/e=44) 2.5. Meanwhile, m/e relative strength values in the organic SOG film 6 are 1.0 common to $H_2$, $CH_3$, $H_2O$, CO and $CO_2$. As the data show, it was found that in the modified SOG film 7, dissociation associated with $H_2O$ (m/e=18) and CH$x$ (m/e=14, 15) is smaller, while that associated with $H_2$ (m/e=2) and $CO_x$ (m/e=28, 44) are greater.

B-4. Plasma Resistance

As an index of oxygen plasma resistance, loss in the thickness of the modified SOG film 7 was evaluated. Change in the film thickness when the modified SOG film 7 formed by implanting $Ar^-$ to the organic SOG film 6 was exposed to oxygen plasma is shown in FIG. 13. The ion implantation was carried out under the following conditions: acceleration energy: 140 keV; dose: $1 \times 10^{15}$ atoms/$cm^2$.

It was found that, when the organic SOG film 6 was exposed to oxygen plasma, the film thickness decreased by 16%, and that, when the modified SOG film 7 was exposed to oxygen plasma, the film thickness did not decrease. However, the original thickness of the modified SOG film 7 is smaller by 25% than that of the organic SOG film 6. The above results demonstrate that, when ion implantation was carried out under the condition such that the organic components may decompose to disappear, the organic SOG film is modified to a film having excellent oxygen plasma resistance. Further, since the loss of percentages in the film thickness is greater in the organic SOG film 6 subjected to ion-implantation than in the organic SOG film 6 subjected to oxygen plasma-exposure, it can be considered that the ion-implanted film has higher density over the other.

Figure 14:
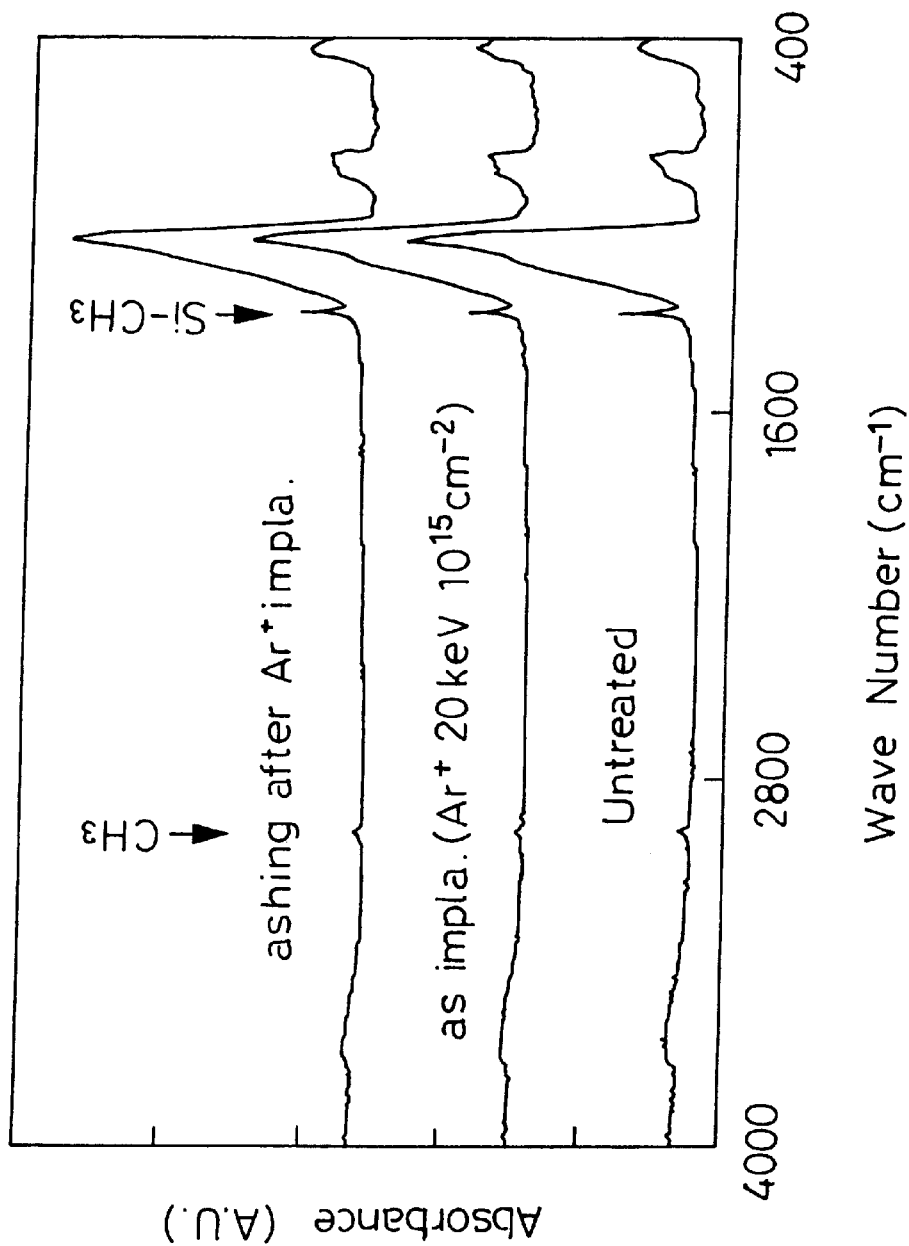

Next, ashing resistance when only the film surface was modified by the ion implantation method was evaluated. IR absorption spectra were measured by means of FT-IR before and after the ashing treatment, and the results are as shown in FIG. 14. The ashing was carried out under the conditions such that a resist having a film thickness of 10 $\mu$m can be removed using a microwave down-flow apparatus.

As FIG. 14 shows, it was found that the internal portion of the modified SOG film remained unmodified in the form of organic SOG film, when $Ar^-$ was implanted with an implantation energy of 20 keV. It was also found that, if such sample is subjected to ashing treatment, the amount of methyl groups in the unmodified portion of the organic SOG film 6 does not decrease. As mentioned above, it was found that the modified SOG film has an excellent ashing resistance. This is because the only surface of the organic SOG 6 is modified by the ion implantation and because the ashing or the decomposition of methyl groups does not influence the inside the organic SOG film 6.

B-5. Water Permeability and Hygroscopicity

It is known that the organic components in the organic SOG film 6 are decomposed when the film 6 is exposed to oxygen plasma, and it is already known in such cases that the components of the film increase and that IR absorbance attributed to Si—O increases.

Figure 15:
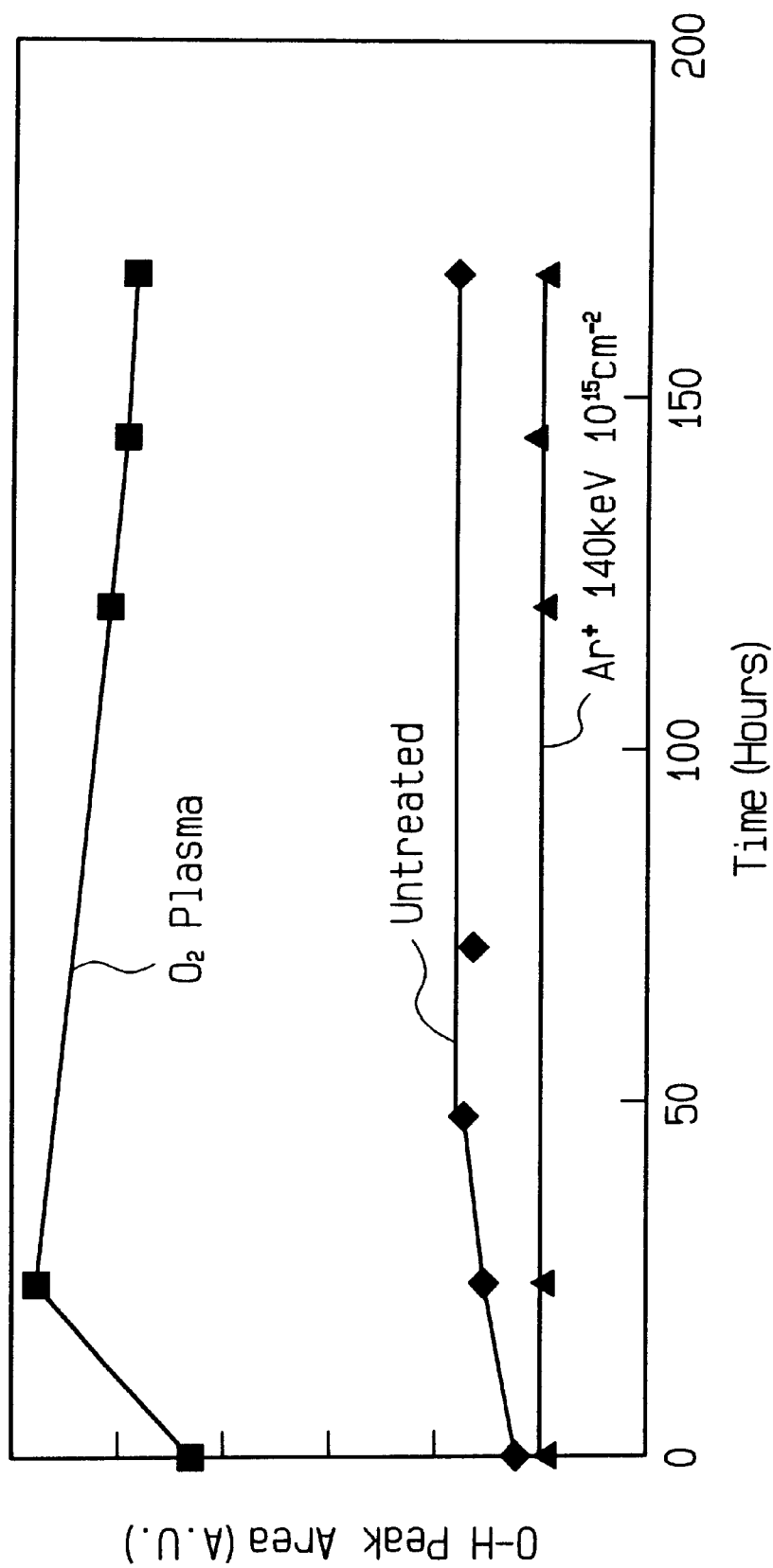

Therefore, hygroscopicity of the modified SOG film 7 modified by ion implantation, that of the organic SOG film 6 modified by oxygen plasma exposure and that of the unmodified organic SOG film 6 were compared. FIG. 15 shows results of evaluation of water contents of these films subjected to treatments and then left to stand under atmospheric conditions in a clean room, respectively. The water content of the film is indicated by the integrated intensity of the absorption (around 3500 $cm^{-1}$) attributed to the O—H group in the IR absorption spectrum. The ionic species used here was argon. The ion implantation was carried out under the following conditions: acceleration energy: 140 keV; dose: $1\times10^{15}$ atoms/cm$^2$.

It can be understood that, when the film was exposed to oxygen plasma, the water content increased not only immediately after the treatment but also after one day. Meanwhile, in the ion-implanted film, the water content did not increase immediately after the treatment, and the increase in the water content is small even if it was left to stand under atmospheric condition in a clean room. Further, the ion-implanted film showed lower hygroscopicity than the unmodified film.

Figure 16:
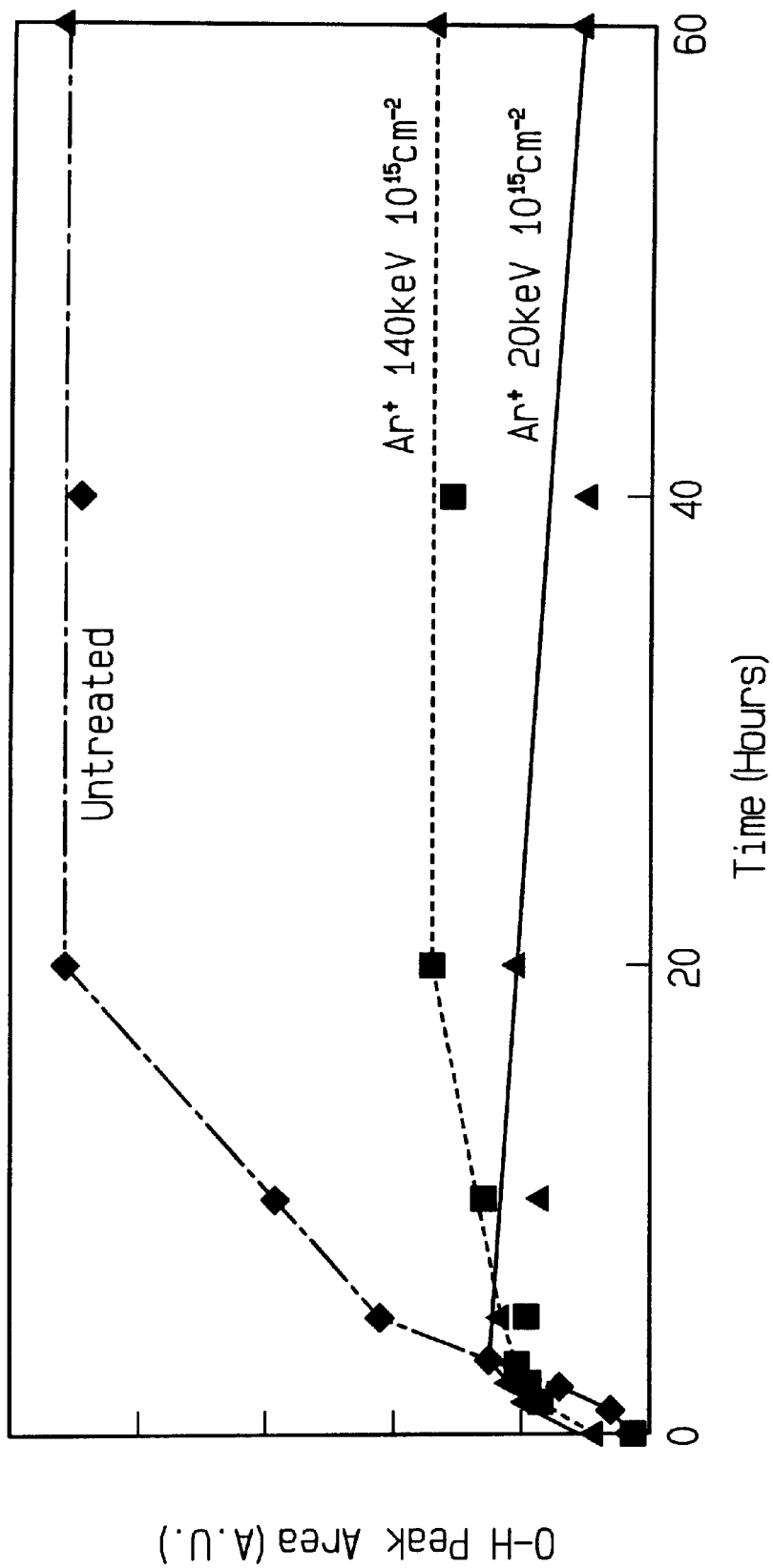

The modified SOG film 7 was subjected to a pressure cooker test (PCT) so as to examine water permeability of the film 7, and the results are shown in FIG. 16. This test is a humidifying test and was carried out at 120° C. under 2 atm. saturated vapor pressure atmosphere. Integrated intensity of the absorption peak (around 3500 cm$^{-1}$) attributed to the O—H bond in the organic SOG film 6 was determined by means of FT-IR and plotted with respect to the PCT time.

A sample modified only on the surface by means of ion implantation (Ar$^-$ 20 keV) was prepared by implanting argon to the organic SOG film 6, which was compared with an entirely modified organic SOG film 6 (Ar$^-$ 140 keV) and an unmodified sample to obtain the following results:

(1) When the unmodified organic SOG film 6 was subjected to PCT, the absorbance around 3500 cm$^{-1}$ attributed to O—H showed a steep increase.

(2) In the modified SOG film, increase in the absorbance around 3500 cm$^{-1}$ attributed to O—H is small. The surface-modified film also showed similar level of increase to that of the entirely modified film.

(3) Since the film modified only on the surface contains unmodified internal portion, it is expected to undergo such change as described in (1) if water reaches the unmodified internal portion of the film subjected to the PCT. However, the change was small within the time period of the PCT (60 hours).

From these results, it can be considered that a layer which inhibits permeation of water was formed by the ion implantation.

Next, determination results of the following various properties will be described.

Figure 17A:
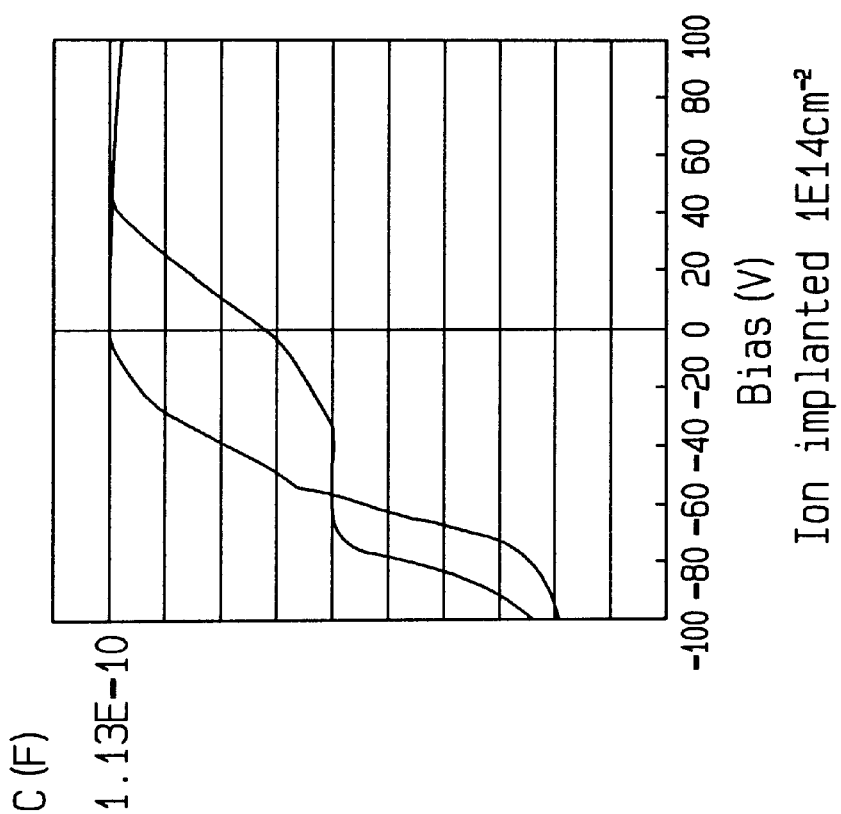
Figure 17B:
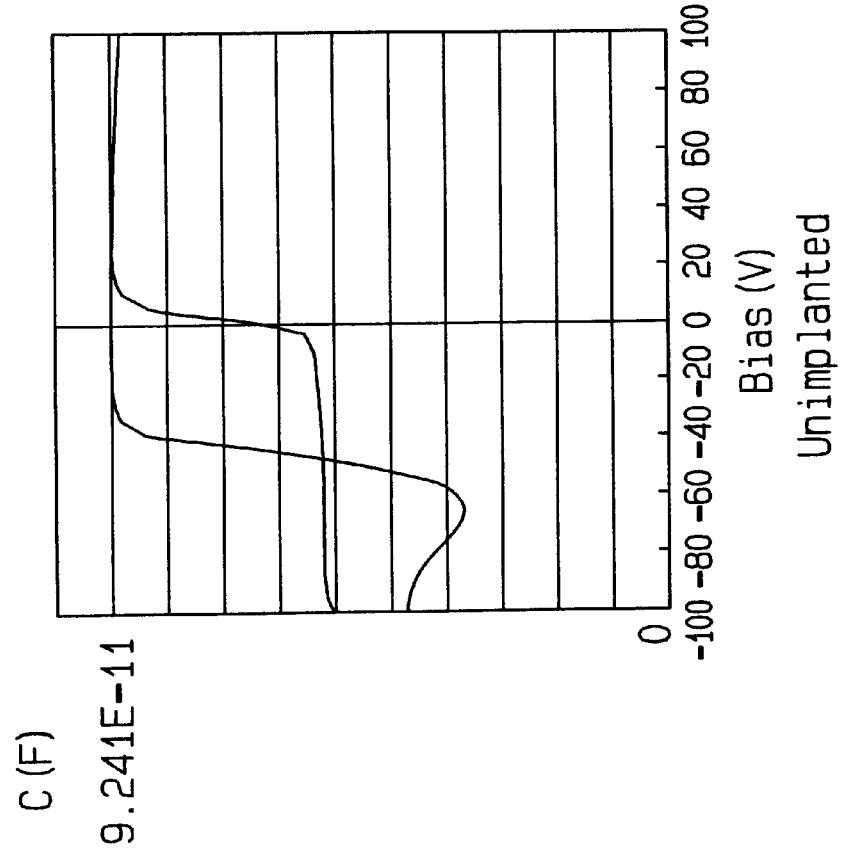
Figure 18A:
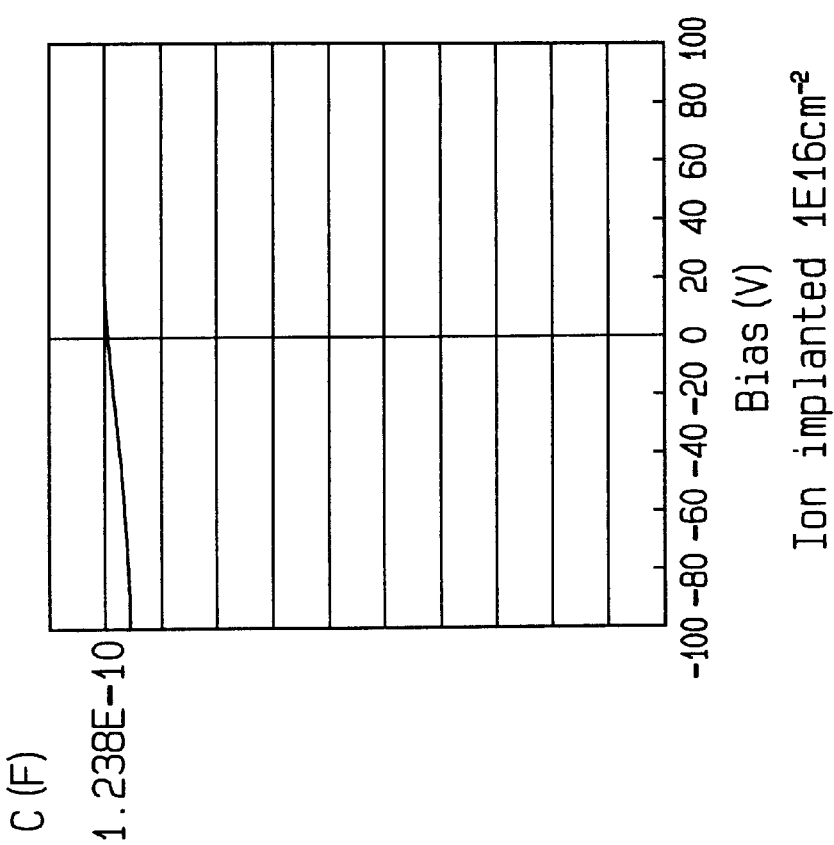
Figure 18B:
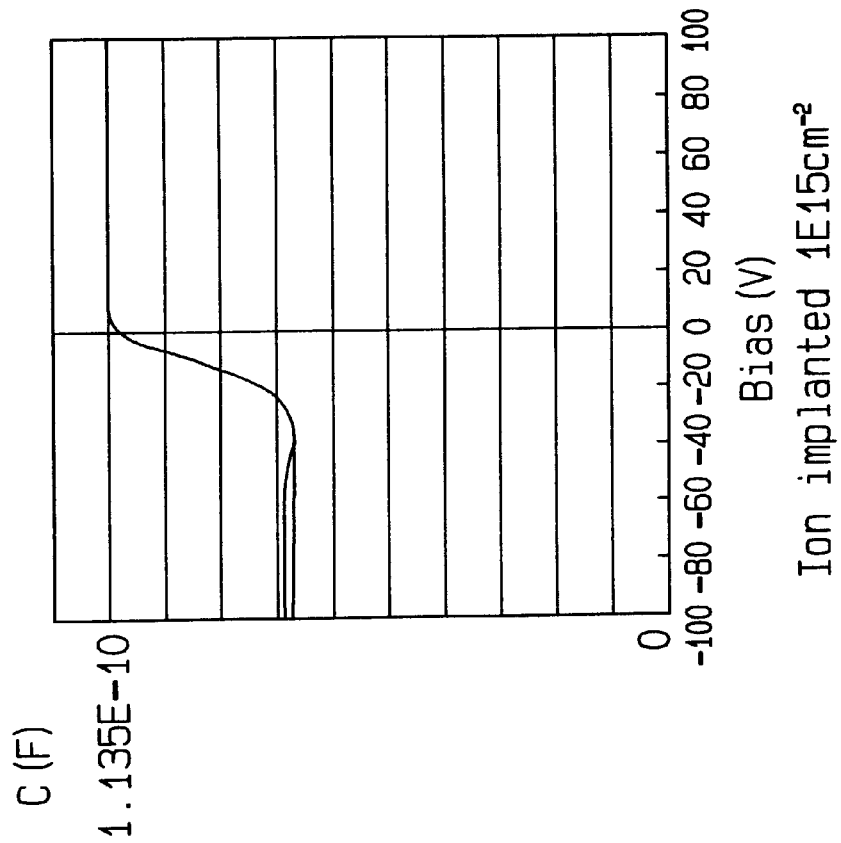

FIGS. 17 and 18 show change in the C-V characteristics depending on the ion dose in the modified SOG film 7. In FIGS. 17 and 18, 1E14 cm$^{-2}$, 1E15 cm$^{-2}$ and 1E16cm$^{-2}$ correspond to doses $1\times10^{14}$ atoms/cm$^2$, $1\times10^{15}$ atoms/cm$^2$ and $1\times10^{16}$ atoms/cm$^2$, respectively. This shows that a dose of $1\times10^{16}$ atoms/cm$^2$ or more is necessary. The vertical axes in FIGS. 17 and 18 represent capacitance, while the horizontal axes represent voltage. E-N in the values taken on the vertical axes means $10^{-N}$. For example, 9.241E-11 is equal to $9.241\times10^{-11}$.

FIG. 19 shows dose dependency of leak current in the modified SOG films 7. With respect to the film thickness of the organic SOG films 6, the unimplanted film and the implanted films (dose: $1\times10^{15}$ atoms/cm$^2$ and $1\times10^{16}$ atoms/cm$^2$) all had a thickness of 2500 Å; whereas the implanted film (dose: $1\times10^{14}$ atoms/cm$^2$) had a thickness of 3000 Å. High leak current in the implanted organic SOG film (dose: $1\times10^{14}$ atoms/cm$^2$) in spite of its great thickness demonstrates that the film has poor quality.

Figure 20:
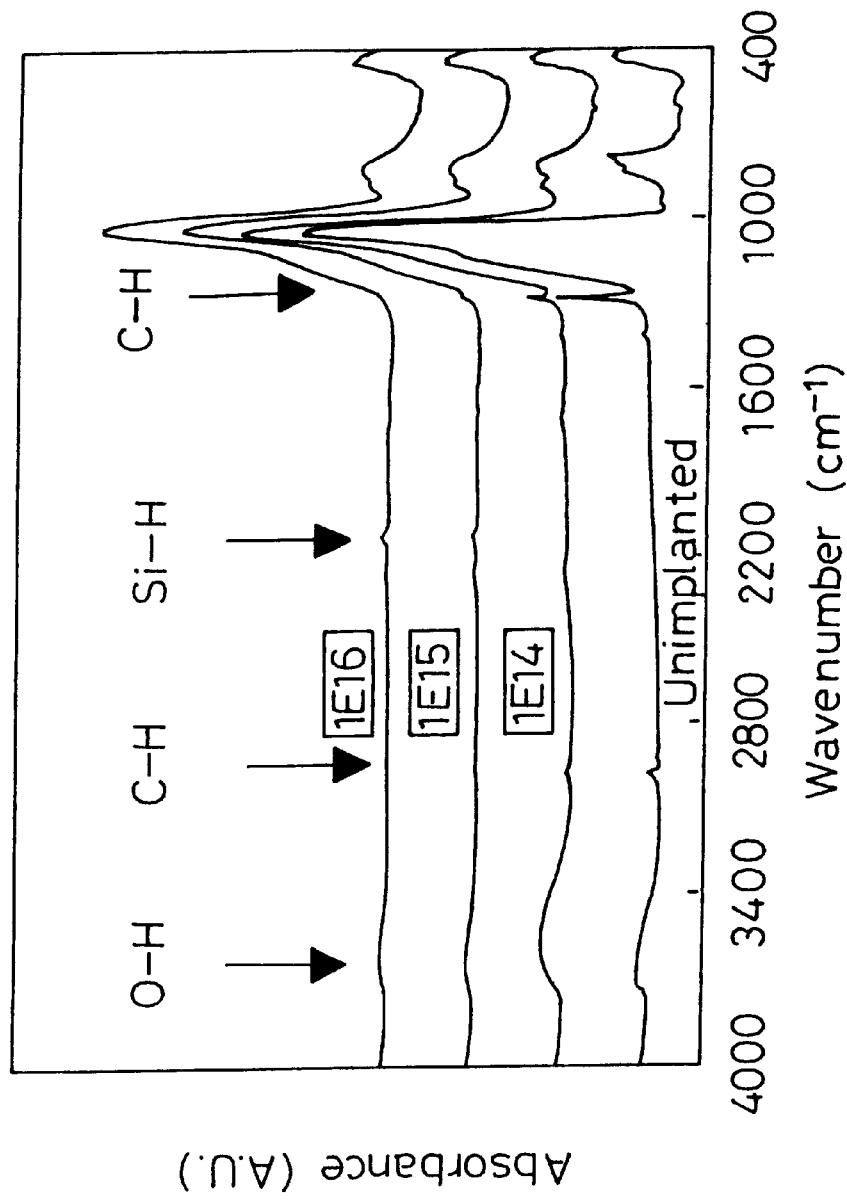

Dose-dependent change in the IR absorption spectrum of the modified SOG films 7 is shown in FIG. 20. Great C—H peaks are observed in the unimplanted film (organic SOG film 6) and in the implanted film (dose: $1\times10^{14}$ atoms/cm$^2$), which means that there are great amounts of residual organic components. The O—H peak is greater in the implanted film (dose: $1\times10^{14}$ atoms/cm$^2$), which demonstrates that the film absorbed water or water was formed in the film. On the other hand, in the implanted films (dose: $1\times10^{15}$ atoms/cm$^2$ and $1\times10^{16}$ atoms/cm$^2$), the O—H peaks are small, which demonstrates that these films have good quality and low water contents.

Figure 21:
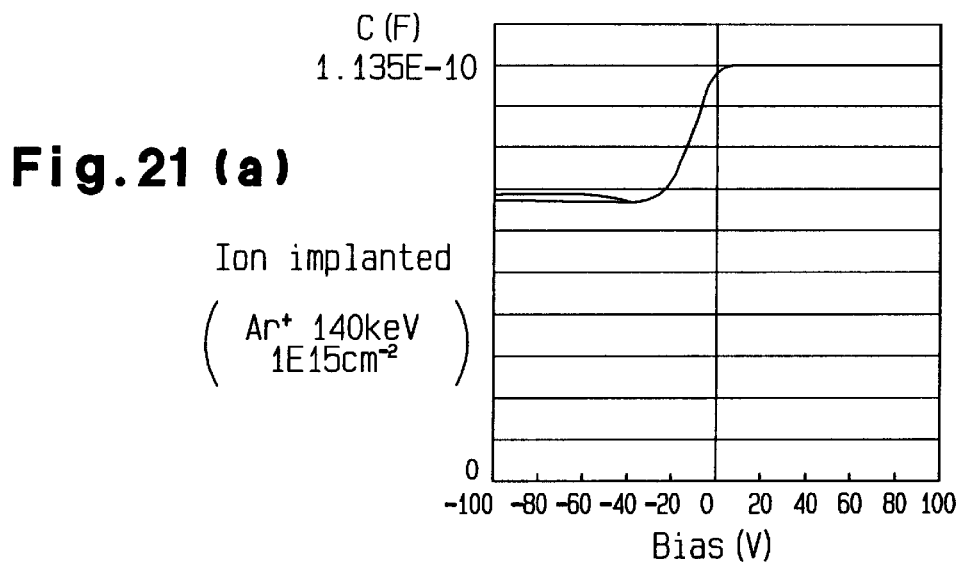
Figure 21:
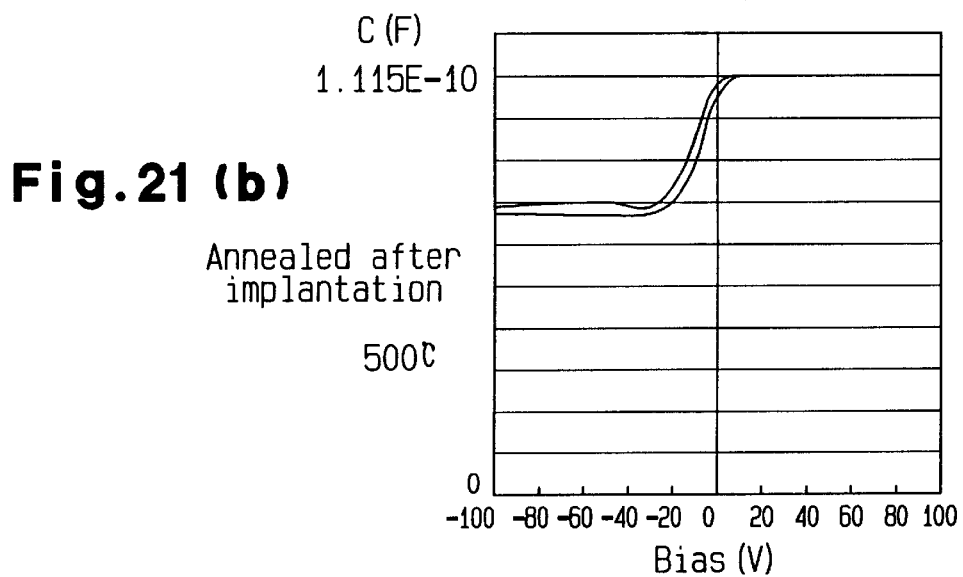
Figure 21:
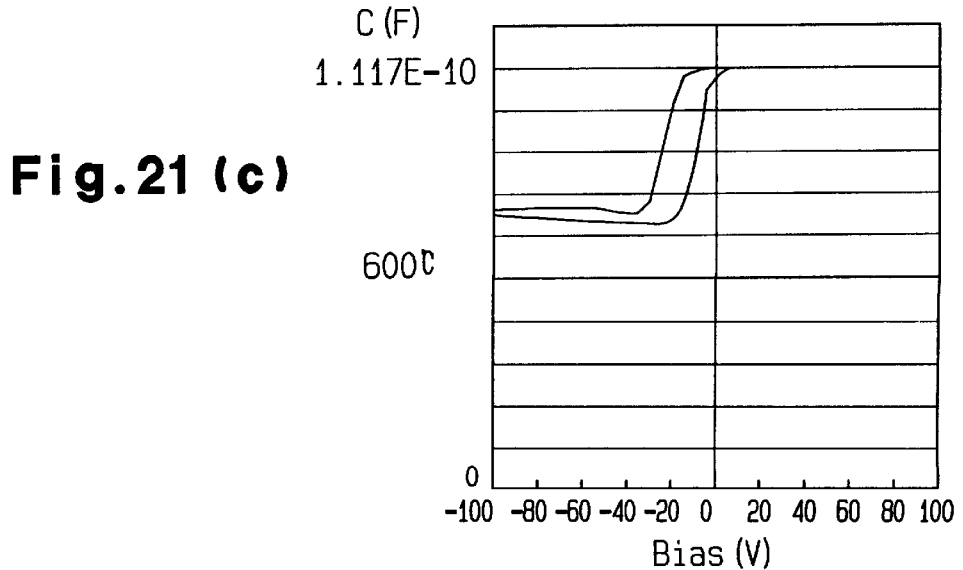

Change in the C-V characteristics (capacitance/voltage characteristics) of the modified SOG film 7 caused by heat treatment is shown in FIGS. 21(a), (b) and (c). It can be understood that the modified SOG film 7 is thermally stable, since the C-V curve was not substantially changed even after application of heat treatment. However, hysterisis was slightly increased by the heat treatment.

Figure 22:
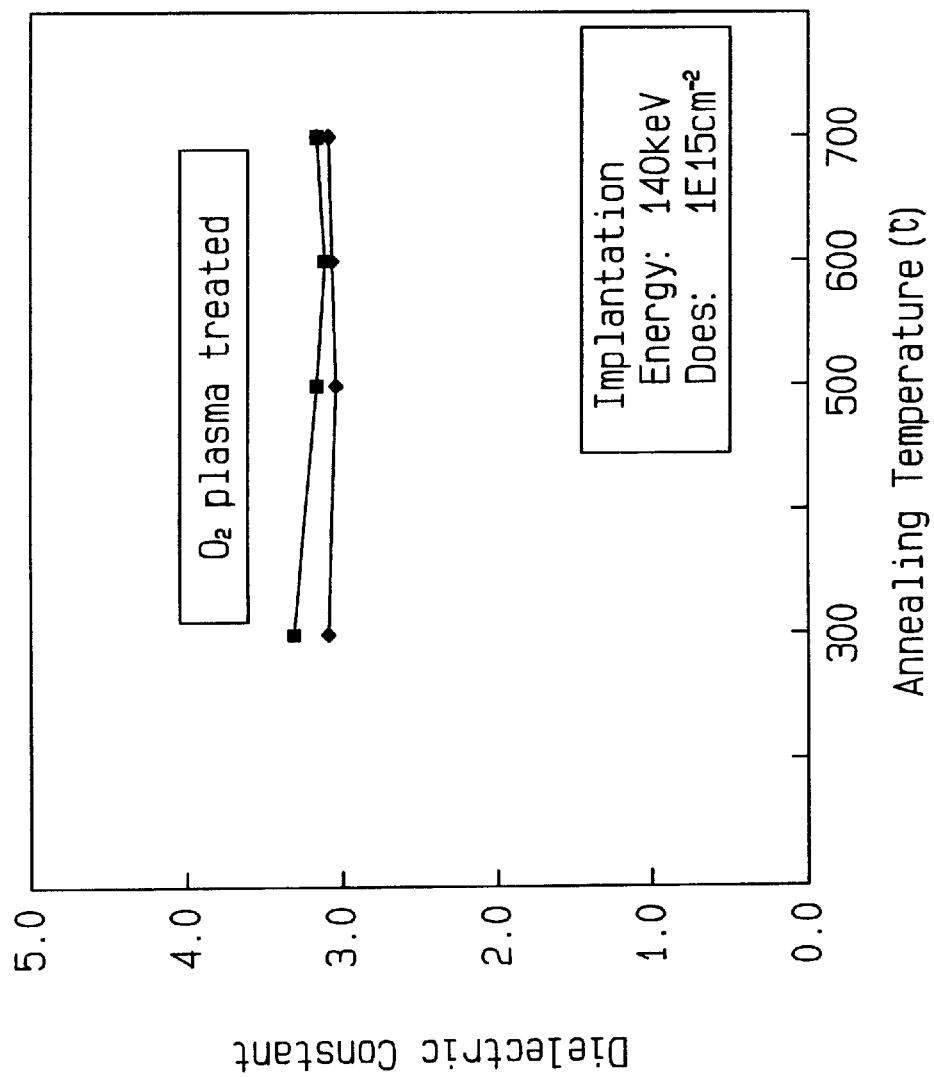

FIG. 22 shows oxygen plasma resistance of the modified SOG film depending on the heat treatment temperature. Dielectric constant of the modified SOG film 7 was not changed substantially even when heat treatment temperature was elevated by application of oxygen plasma treatment. This demonstrates that the modified SOG film has excellent quality and stability.

Figure 23:
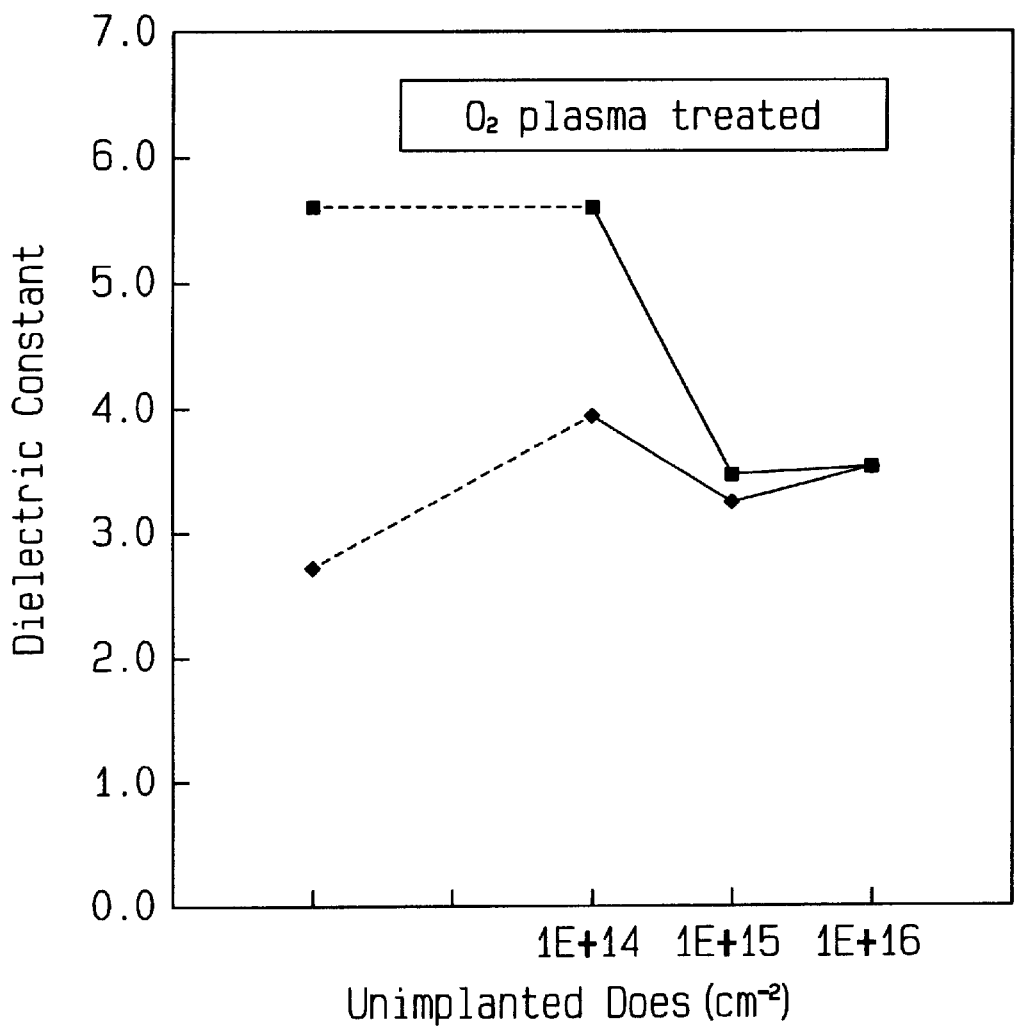

FIG. 23 shows dose-dependent oxygen plasma resistance. In the implanted film (dose: $1\times10^{14}$ atoms/cm$^2$), dielectric constant of the film was greatly increased by application of oxygen plasma treatment to such a level as achieved in the unimplanted film (organic SOG film 6). This demonstrates that it is essential to decompose the organic components in the organic SOG film 6 by the ion implantation so as to improve oxygen plasma resistance.

Figure 24:
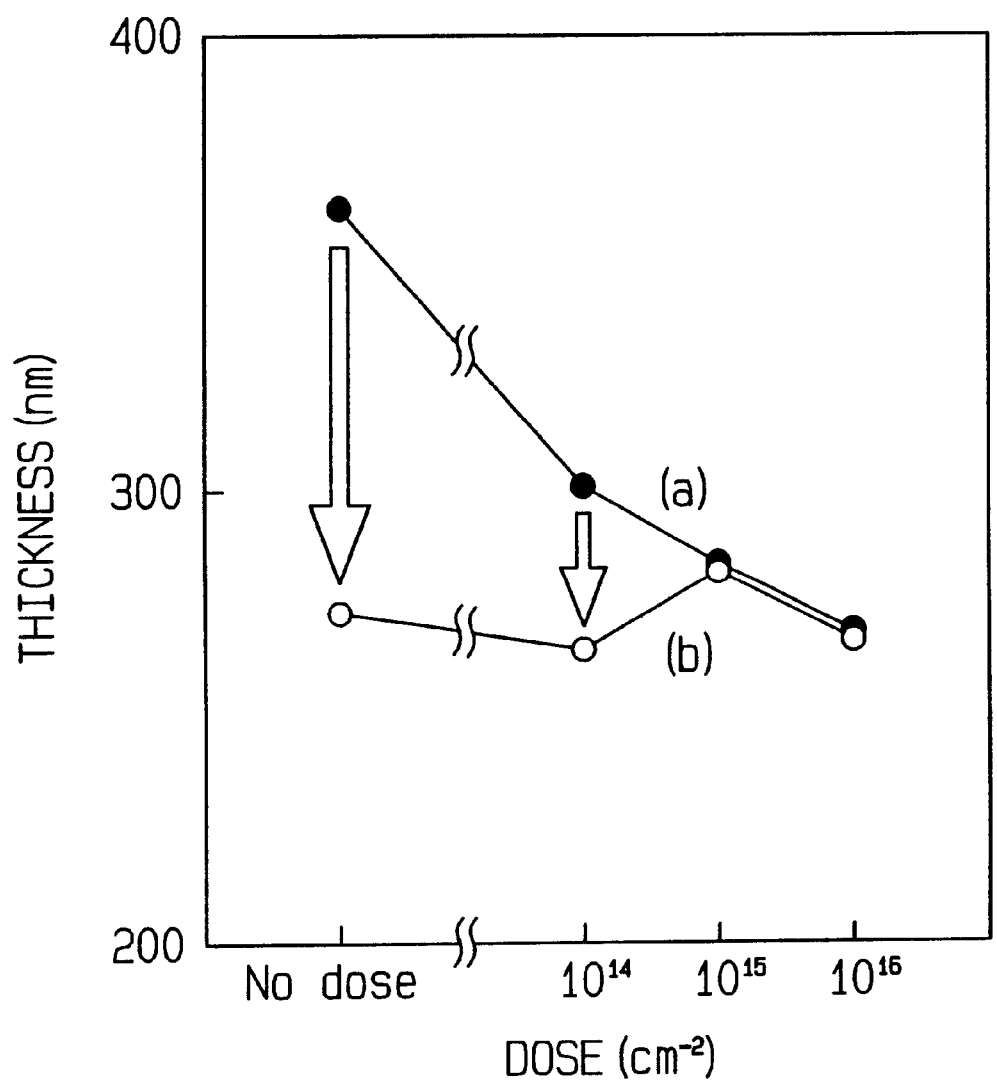

The organic SOG film 6 was implanted with Ar$^{-1}$ to form a modified SOG film 7, which was then exposed to oxygen plasma, and change in the film thickness depending on the Ar$^-$ dose is shown in FIG. 24. The oxygen plasma treatment was carried out using a microwave down-flow apparatus under the following conditions: microwave output: 1000 W; gas: mixed gas of oxygen, nitrogen and hydrogen; pressure: 400 Pa; treatment temperature: 220° C.; treatment time: 2.5 min; and ion implantation energy: 140 keV.

As described referring to FIG. 13, the graph of FIG. 24 likewise shows that the film thickness is greatly reduced when the organic SOG film 6 was exposed to oxygen plasma. Even when the modified SOG film 7 was exposed to oxygen plasma, film thickness was also reduced in the case of the film modified at the dose of $1\times10^{14}$ atoms/cm$^2$, and no loss in the film thickness in the case of the film modified at the dose of $1\times10^{15}$ atoms/cm$^2$. Accordingly, it can be understood that a dose of $1\times10^{15}$ atoms/cm$^2$ or more is necessary so as to prevent shrinkage of the modified SOG film 7 to be caused by the oxygen plasma exposure.

Figure 25:
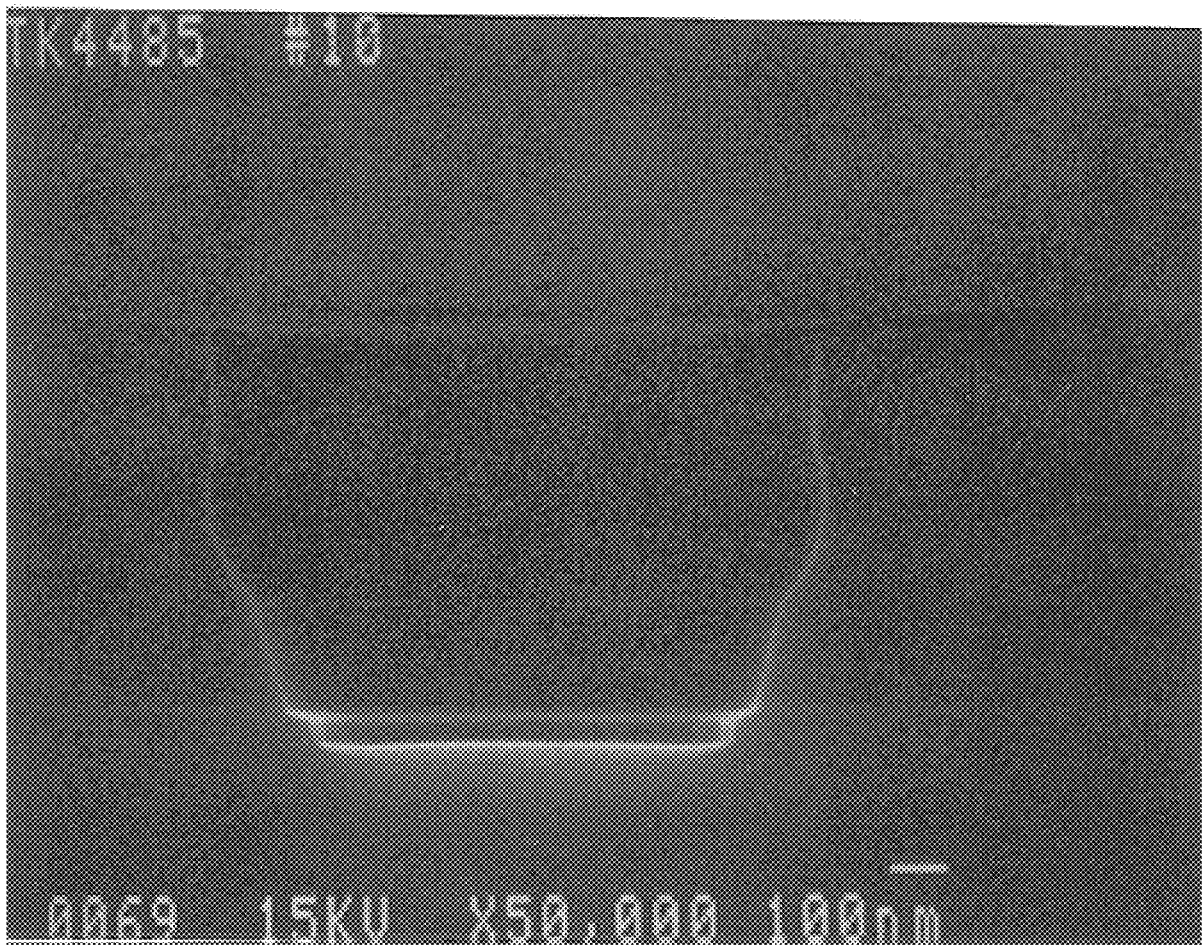
FIGS. 25 to 27 are microscopic photographs showing cross sections of SOG films.
Figure 26:
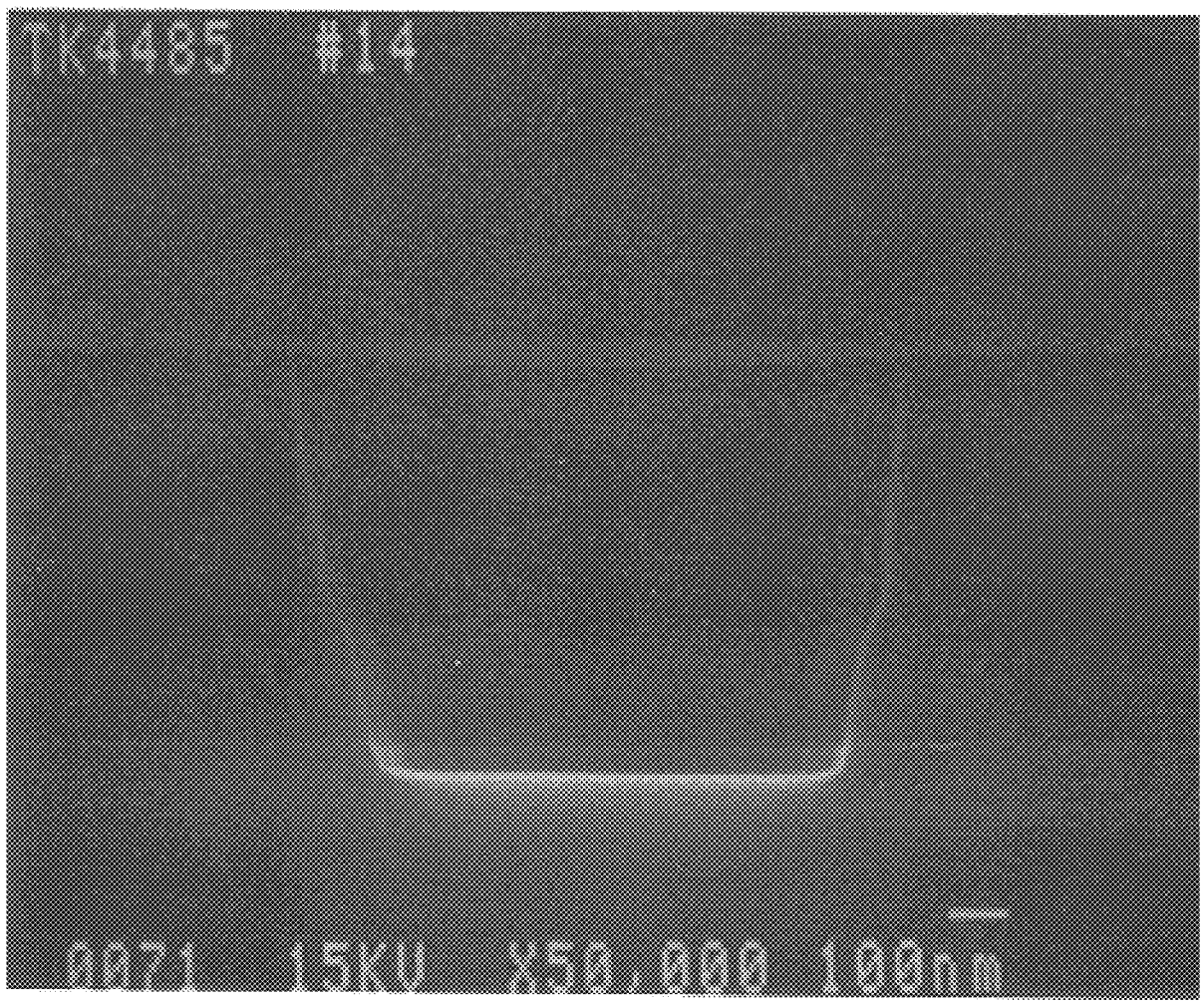
Figure 27:
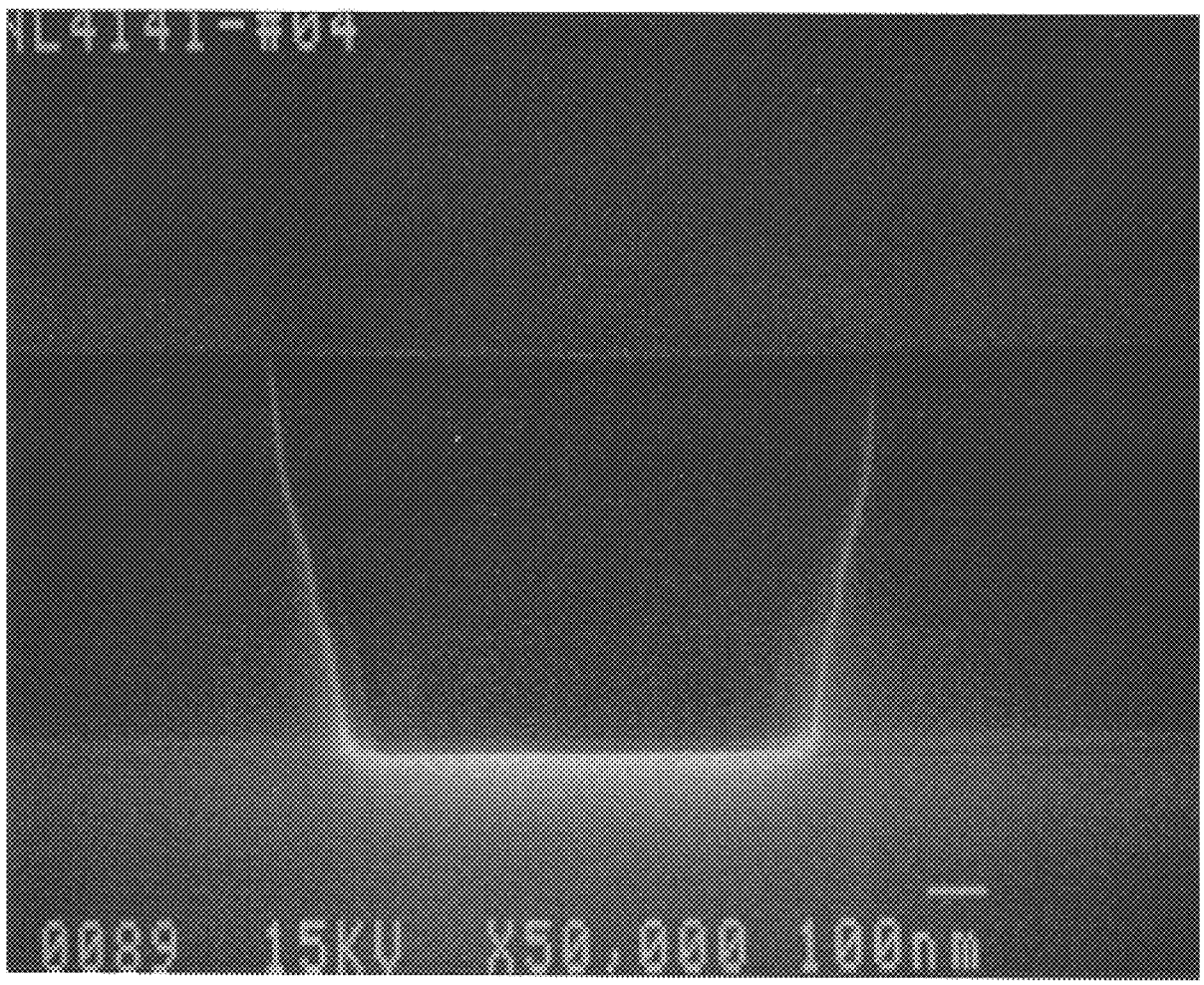

FIG. 25 is a microscopic photograph showing the cross-sectional profile of a via hole 9 in the film implanted with Ar$^-$ at a dose of $1\times10^{15}$ atoms/cm$^2$ with an acceleration energy of 20 keV, observed cross sectionally by a SEM. FIG. 26 is a microscopic photograph showing the cross-sectional profile of a via hole 9 in the film implanted with Ar$^-$ at a dose of $1\times10^{15}$ atoms/cm$^2$ with an acceleration energy of 90 keV observed cross sectionally by the SEM. FIG. 27 is a microscopic photograph showing the cross-sectional profile of a via hole 9 in the film implanted with Ar$^-$ at a dose of $1\times10^{15}$ atoms/cm$^2$ with an acceleration energy of 140 keV observed cross sectionally by the SEM.

While recesses are formed in the examples shown FIGS. 25 and 26, no recess is formed in the example shown in FIG. 27. These results demonstrate that an acceleration energy of 140 keV or more and an Ar$^+$ dose of $1\times10^{15}$ atoms/cm$^2$ or more are necessary so as to prevent the modified SOG film 7 from undergoing shrinkage.

Figure 28:
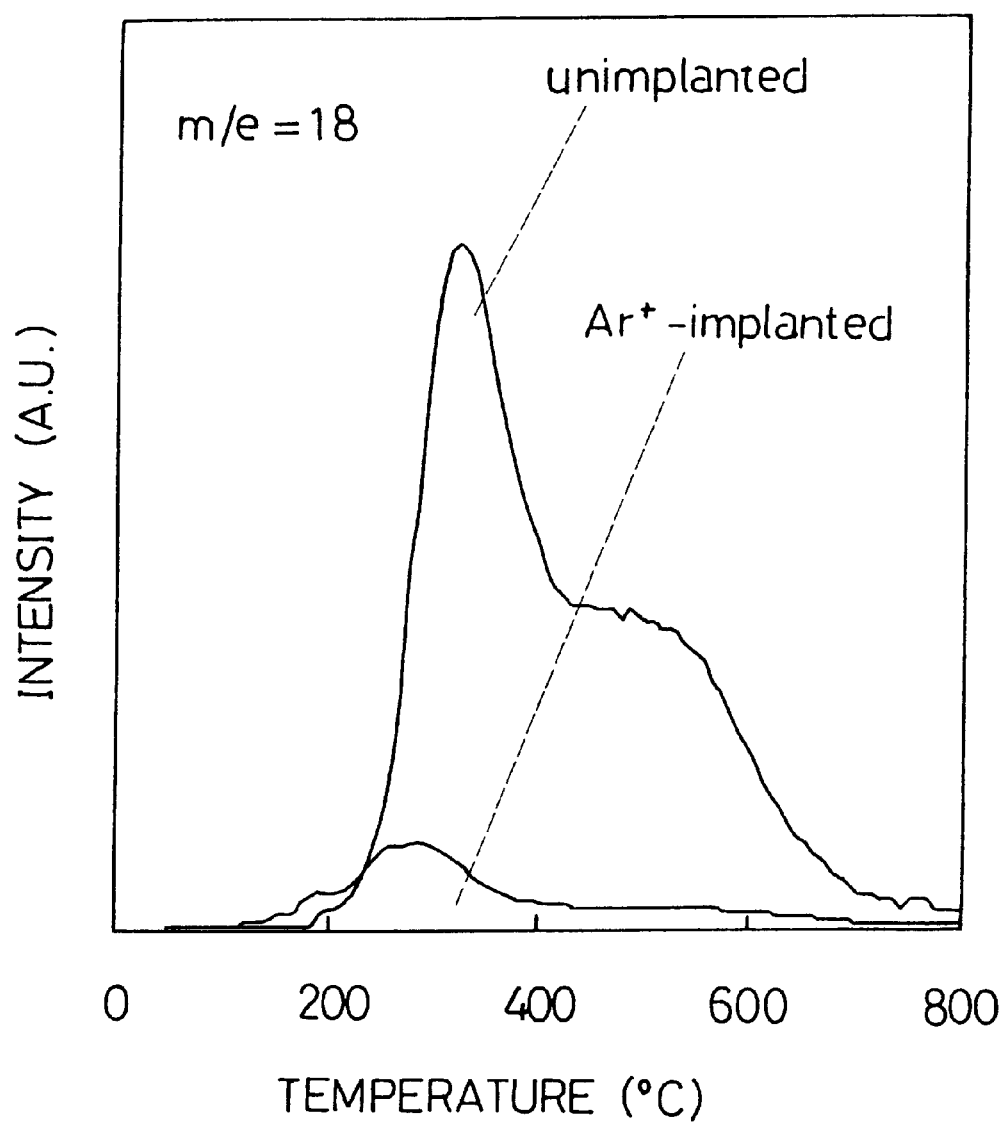
FIG. 28 is a graph showing characteristics of the SOG film.

H$_2$O (m/e=18) was evaluated by means of TDS under the same conditions as in FIG. 12, and the result is shown in FIG. 28. As shown in FIG. 28, it can be understood that dissociation of $CH_3$ (m/e=15) is small in the modified SOG film 7.

Figure 29:
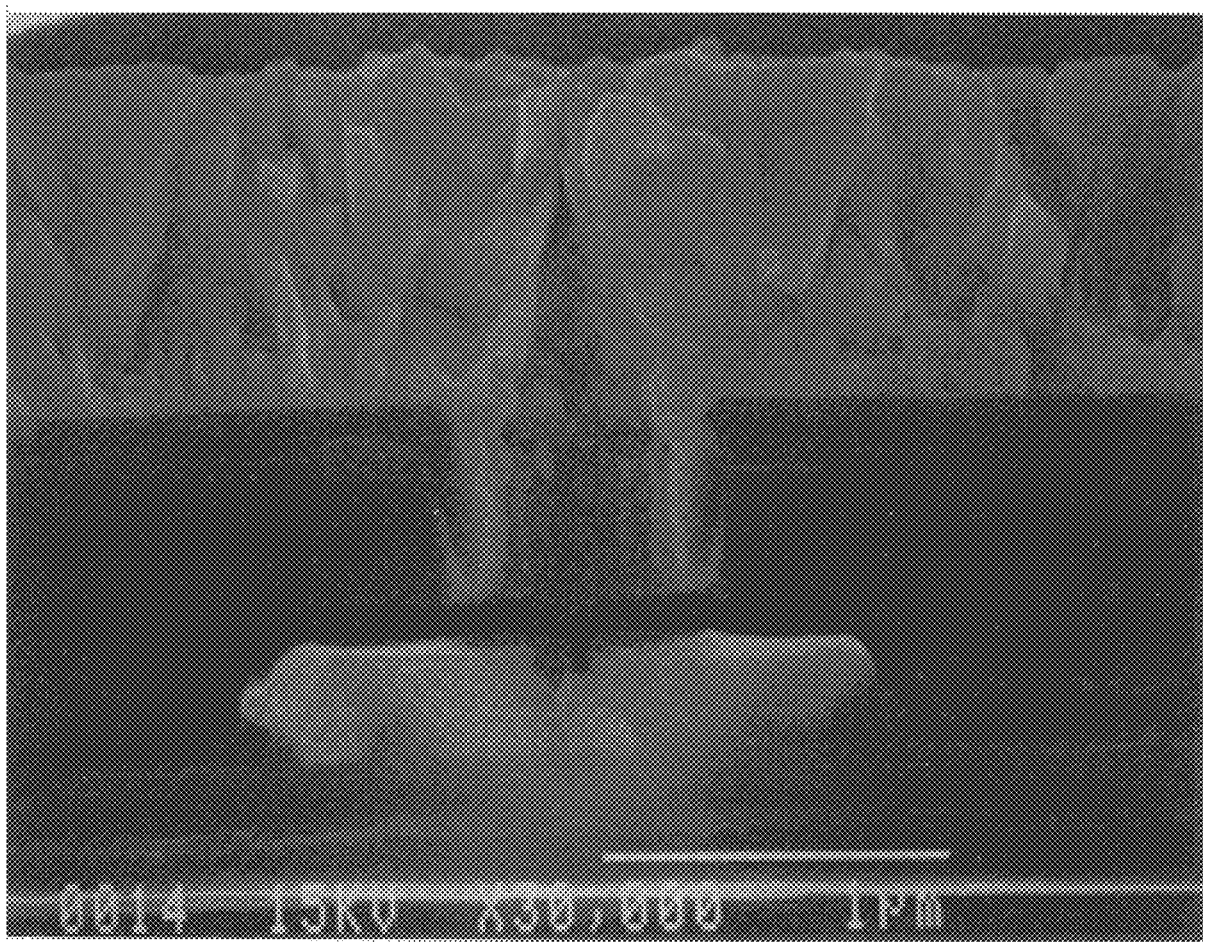
FIGS. 29 and 30 are microscopic photographs showing cross sections of SOG films.
Figure 30:
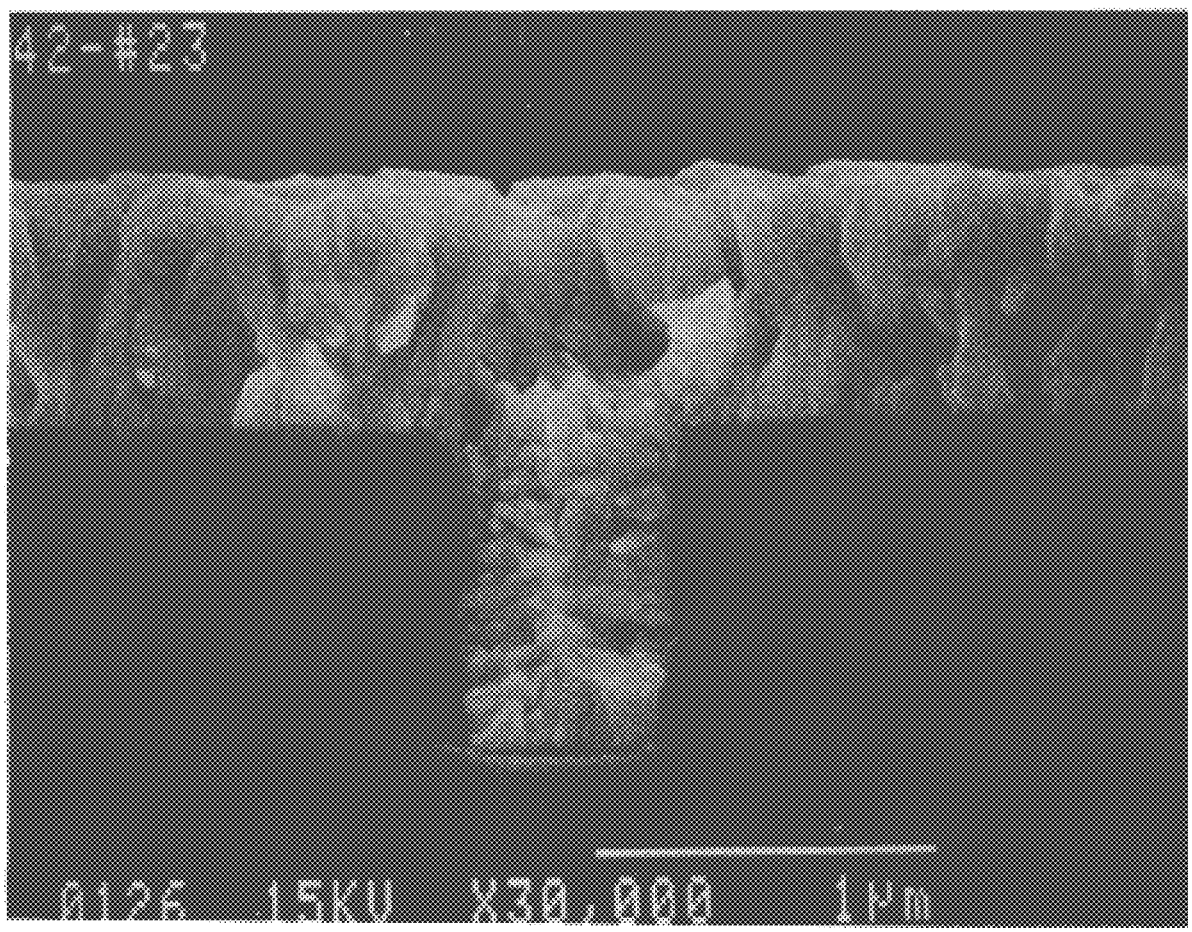

FIGS. 29 and 30 are microscopic photographs showing cross-sectional profiles of via holes 9 in which tungsten plugs 12 are formed by means of blanket-tungsten CVD, observed cross sectionally by the SEM. FIG. 29 is of the case where the organic SOG film 6 is not subjected to ion implantation as described above; whereas FIG. 30 is the case where the organic SOG film 6 is subjected to $Ar^-$ implantation to form a modified SOG film 7 (dose: $1\times10^{15}$ atoms/$cm^2$; acceleration energy: 140 keV).

As shown in FIG. 29, in the case where no $Ar^+$ implantation was carried out, tungsten plug 12 is not fully embedded in the via hole 9. Meanwhile, a tungsten plug 12 is fully embedded in the via hole 9 in the modified SOG film 7 as shown in FIG. 30. This may be because the amounts of dissociated $H_2O$ and $CH_3$ are small in the modified SOG film 7.

Figure 31:
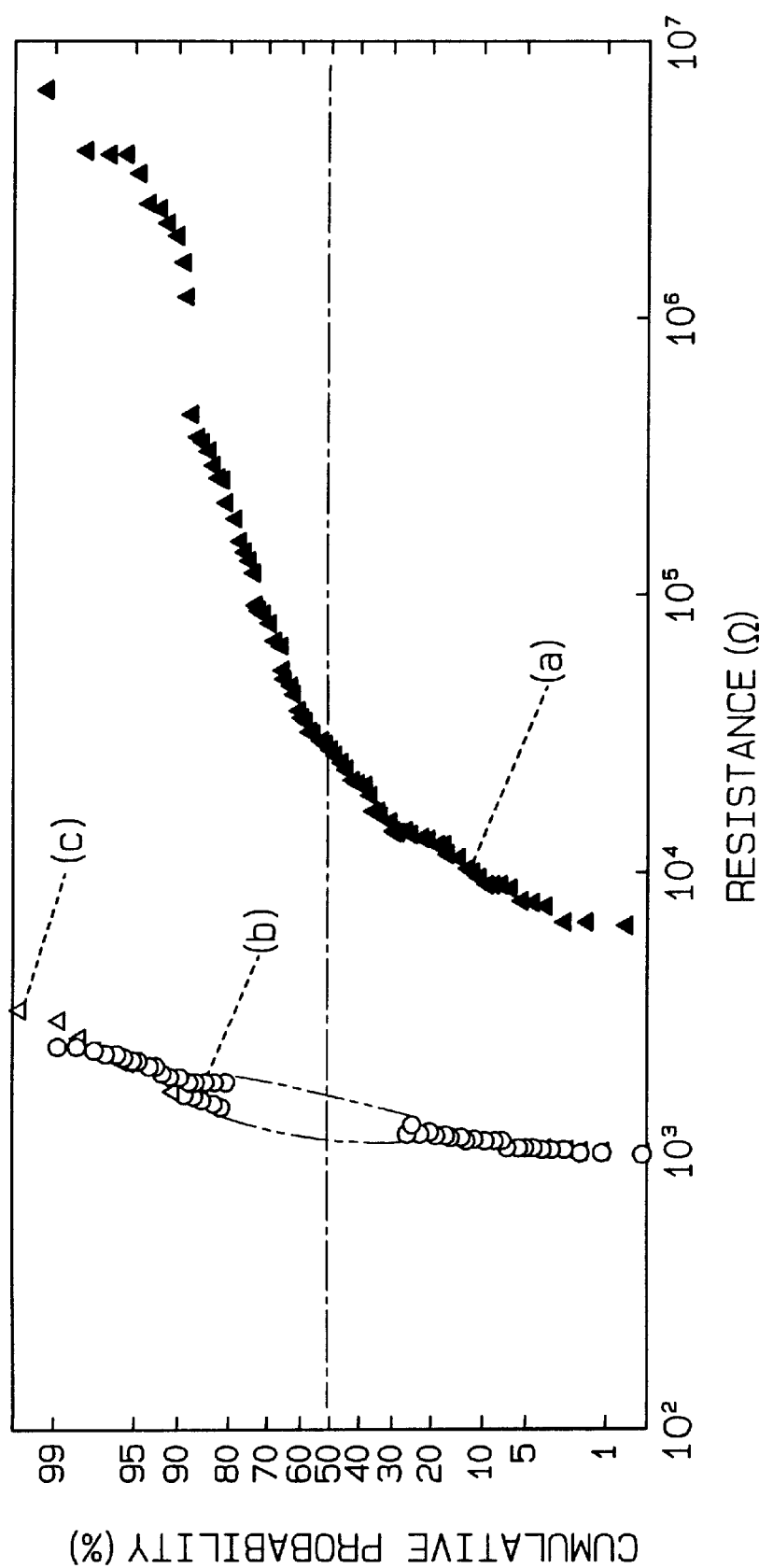
FIGS. 31 to 36 are charts showing various properties of SOG films.

FIG. 31 shows variations in the resistance when 1000 via holes 9 having tungsten plugs or aluminum electrodes formed therein are connected in series, in which:

the curve (a) is of the case where the via holes 9 and aluminum electrodes were formed without subjecting the organic SOG film 6 to ion implantation;

the curve (b) is of the case where the via holes 9 and aluminum electrodes were formed in a modified SOG film 7 implanted with $Ar^-$; and the curve (c) is of the case where the via holes 9 and tungsten plugs were formed in a modified SOG film 7 implanted with $Ar^-$.

The via holes 9 have a diameter of 0.7 μm. It can be understood that the resistance in the modified SOG film 7 is far smaller than in the organic SOG film 6.

Next, FIGS. 32 to 36 show results of various tests carried out employing a test device fabricated by forming an interlayer insulating film consisting of a silicon oxide film 8/an organic SOG film 6 (modified SOG film 7)/a silicon oxide film 5 on an NMOS transistor as shown in FIGS. 1 to 3.

Figure 32:
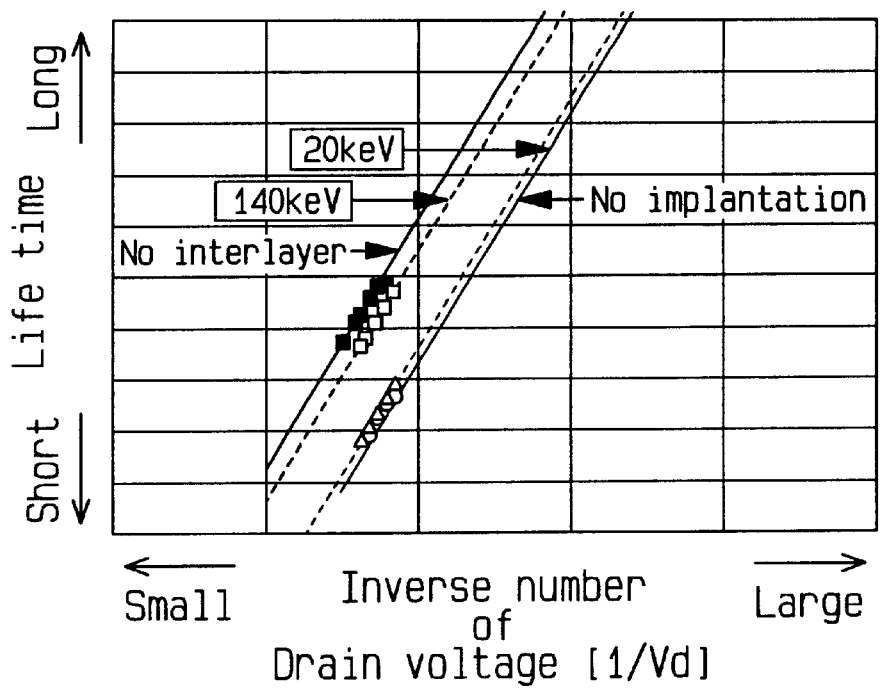

FIG. 32 shows drain voltage dependency of the hot carrier life in an NMOS transistor. The hot carrier life referred to here means the time elapsed until the mutual conductance Gm is deteriorated to a certain level and is a parameter showing the life of transistor. As clearly shown in FIG. 32, the transistor employing a modified SOG film 7, particularly with the acceleration energy of 140 keV, has a hot carrier life of about twice as much as that of the transistor employing an unimplanted organic SOG film.

Figure 33:
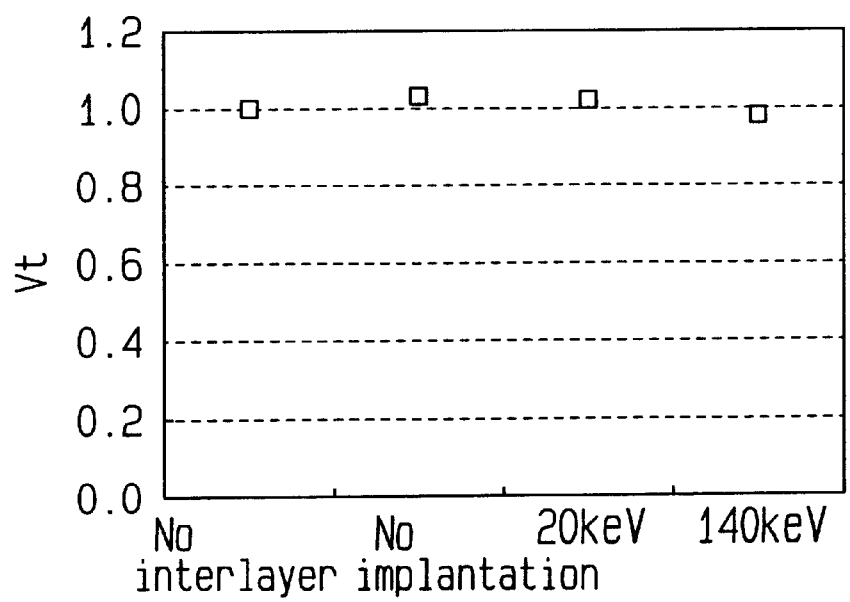
Figure 34:
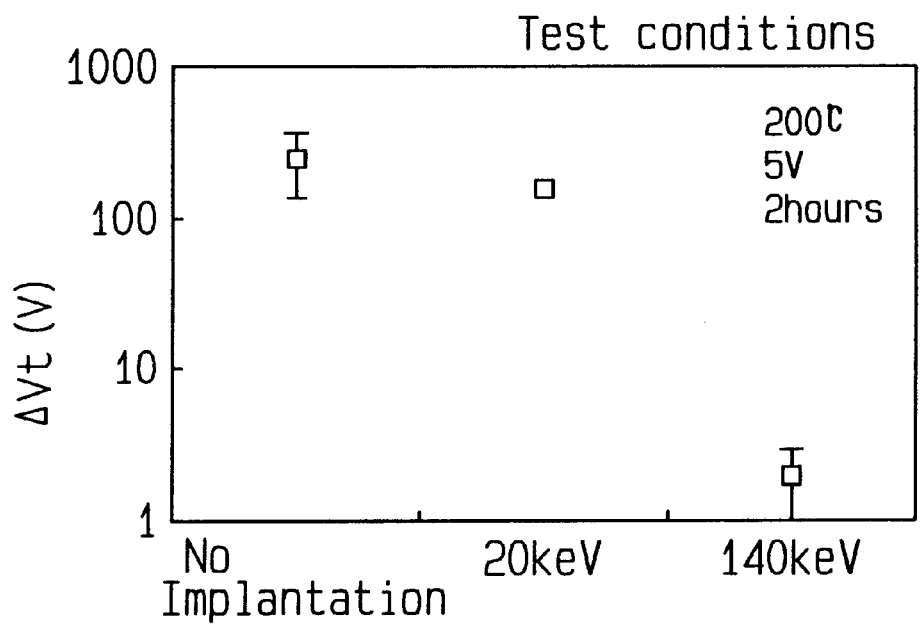

FIGS. 33 and 34 show threshold values Vt measured before and after an acceleration test, respectively. In the acceleration test, a voltage of 5 V is continuously applied to the transistor of the test device at a temperature of 200° C. for 2 hours. FIG. 33 shows the threshold value Vt measured before the acceleration test; while FIG. 34 shows amount of change in the threshold value Vt after the acceleration test. As shown in FIG. 33, before the acceleration test, both the transistor having the unimplanted organic SOG film and the transistor having the modified SOG film 7 showed no substantial difference in their threshold values.

However, as shown in FIG. 34, in the case where the unimplanted organic SOG film is employed, the threshold value Vt changes greatly after the test. On the other hand, in the case where a modified SOG film 7 (particularly with an acceleration energy of 140 keV) is employed, there is observed substantially no change in the threshold value Vt irrespective of the gate length. These results show that the threshold value characteristics of the MOS transistor having the modified SOG film 7 can be stabilized for a long time.

Figure 35:
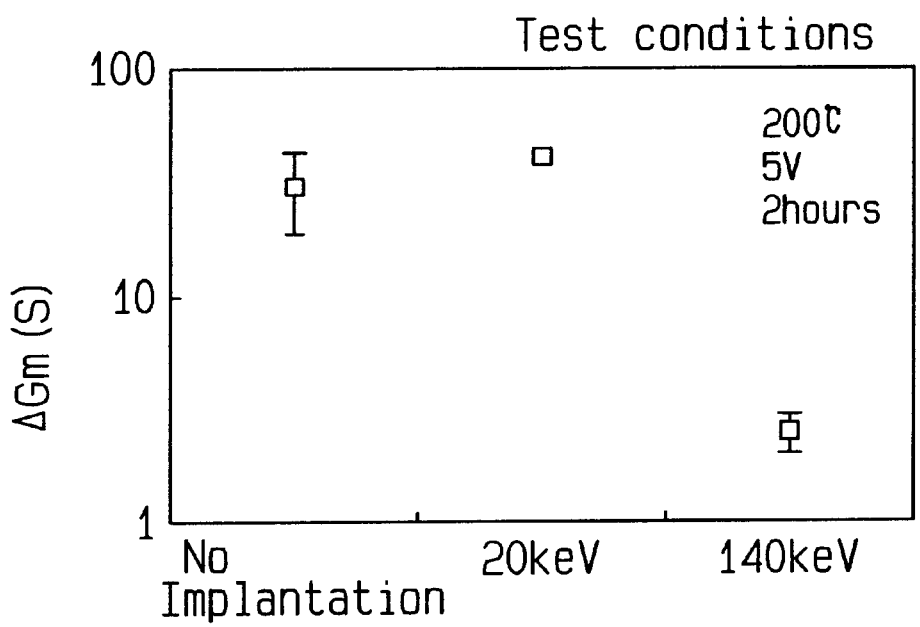

FIG. 35 shows the amount of change in the mutual conductance Gm of each transistor determined by measuring it before and after the acceleration test like in FIG. 34. In the case of a transistor employing an unimplanted organic SOG film, the Gm changed greatly after the test. On the other hand, in the case where a modified SOG film 7 (particularly with an acceleration energy of 140 keV) is employed, there is observed substantially no change in Gm irrespective of the gate length. These results show that the Gm of the MOS transistor can be stabilized for a long time.

Figure 36:
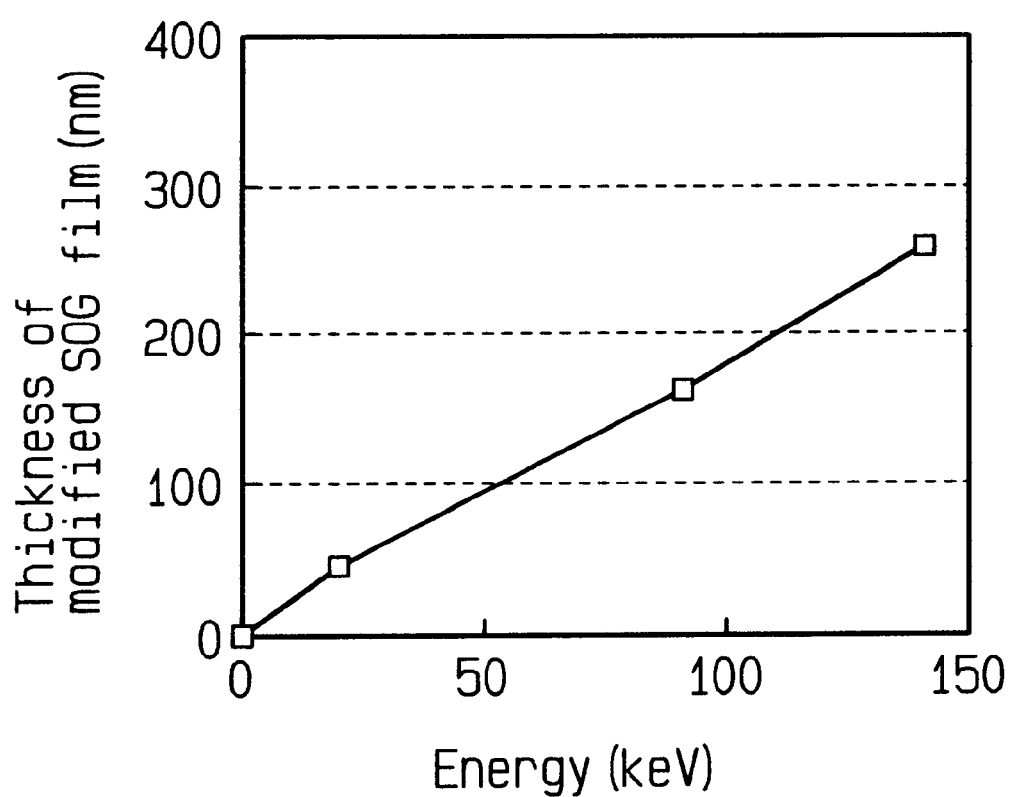

Incidentally, in FIGS. 31 to 35, in the case where the modified SOG film 7 formed with an acceleration energy of 20 keV, it shows very small improving effects compared with the case of the film formed with an acceleration energy of 140 keV. This may be because that, as shown in FIG. 36, the acceleration energy (implantation energy) and the depth of modification in the organic SOG film have a substantially positive correlation, and in the case of the film modified with an acceleration energy of 20 keV, only the surface layer (about 50 nm) of the organic SOG film 6 is modified.

Next, a process for producing a semiconductor device according to a second embodiment of the invention will be described referring to FIGS. 37 to 39. It should be noted here that like and same components as in the first embodiment are affixed with the same reference numbers respectively and detailed description of them will be omitted.

Figure 37A:
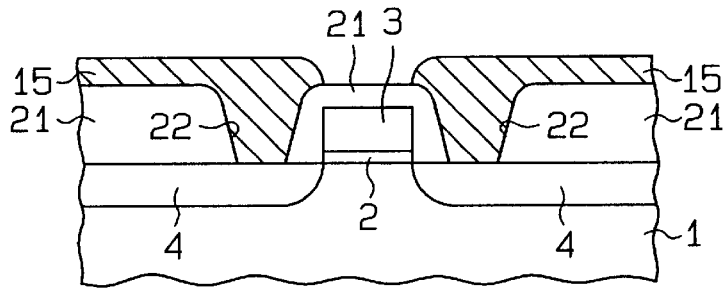
FIGS. 37(*a*), 37(*b*) and 37(*c*), FIGS. 38(*a*), 38(*b*) and 38(*c*) and FIGS. 39(*a*), 39(*b*) and 39(*c*) show in cross-sectional views a process for producing a semiconductor device according to a second embodiment of the present invention.
Figure 37B:
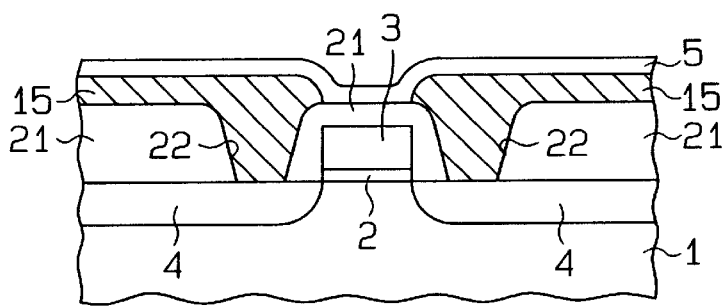
Figure 37C:
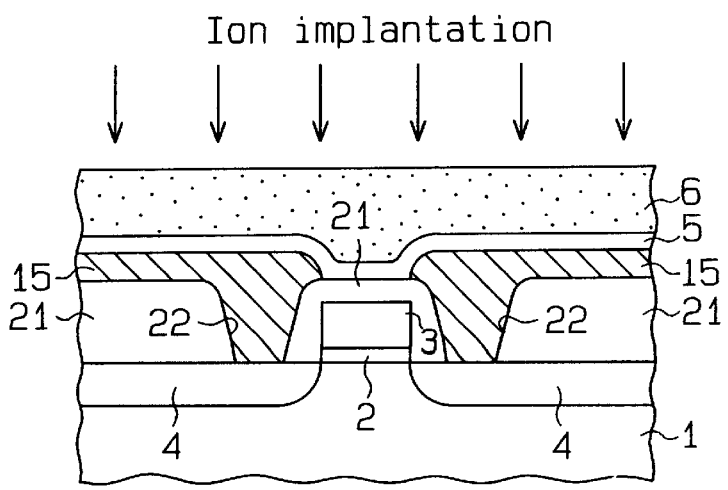

In Step (1) shown in FIG. 37(*a*), on a p-type (or n-type) single crystal silicon substrate 1 are formed a gate insulating film 2, a gate electrode 3 and source and drain regions 4 to complete an MOS transistor. An interlayer insulating film 21 is then formed over the entire surface of the device, and via holes 22 are defined through the interlayer insulating film 21 locating on the source and drain regions 4. Subsequently, an aluminum film is deposited by means of sputtering over the entire surface of the device including the bores of the via holes 22, and the thus formed aluminum film is subjected to anisotropic etching to form source and drain electrodes (source and drain wiring) 15 having desired patterns.

In Step (2) shown in FIG. 37(*b*), a silicon oxide film 5 is formed over the entire surface of the device. In Step (3) shown in FIG. 37(*c*), an organic SOG film 6 is formed on the silicon oxide film 5, followed by ion implantation to convert the organic SOG film 6 into a modified SOG film 7.

Figure 38A:
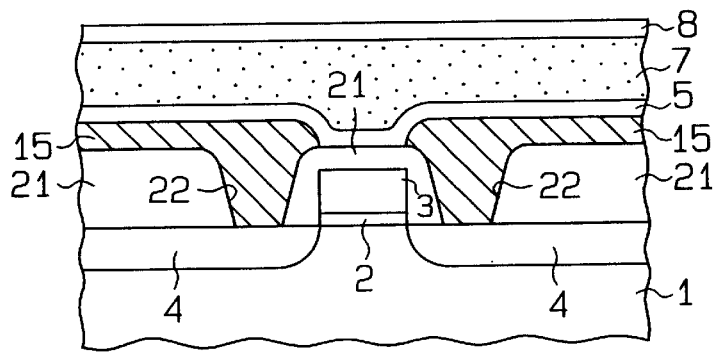
Figure 38B:
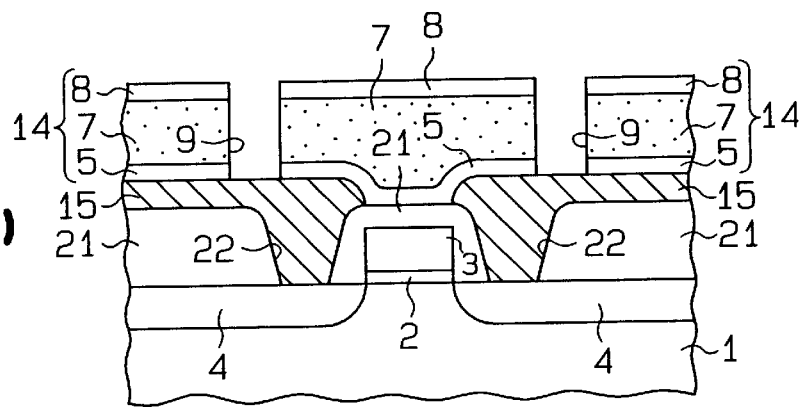
Figure 38C:
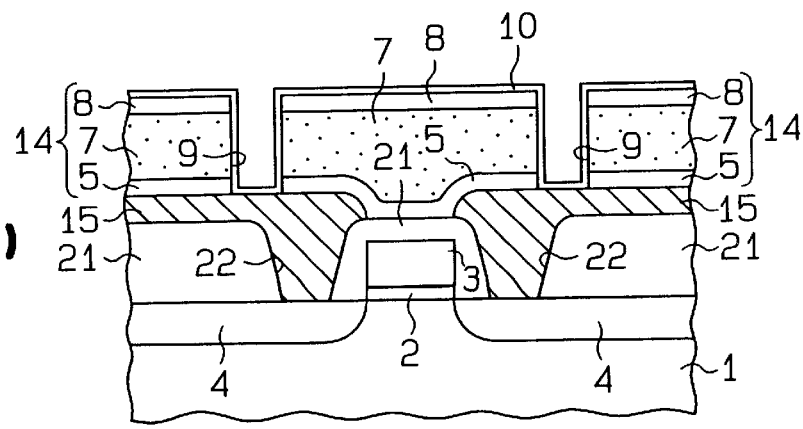

In Step (4) shown in FIG. 38(*a*), a silicon oxide film 8 is formed on the modified SOG film 7. In Step (5) shown in FIG. 38(*b*), the device is subjected to anisotropic etching using a mixed gas of carbon tetrafluoride and hydrogen as an etching gas to form via holes 9 through the films 5, 7 and 8 present on the source and drain areas 4. In Step (6) shown in FIG. 38(*c*), a titanium nitride thin film 10 is formed on the silicon oxide film 8 including the bores of the via holes 9 by means of magnetron sputtering.

Figure 39A:
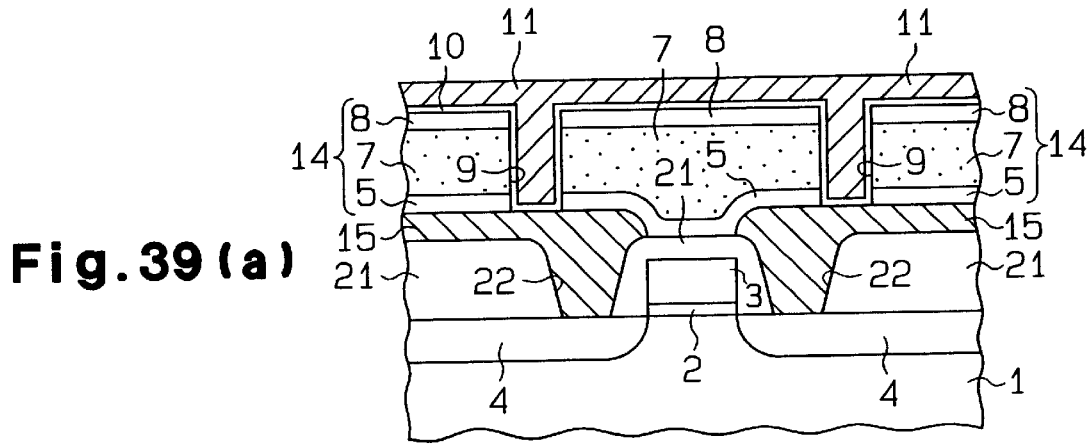
Figure 39B:
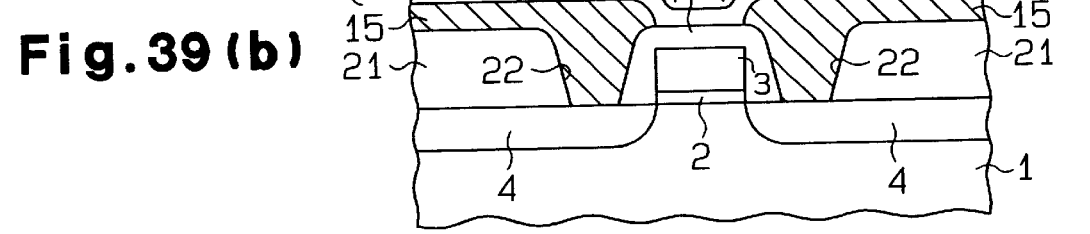
Figure 39C:
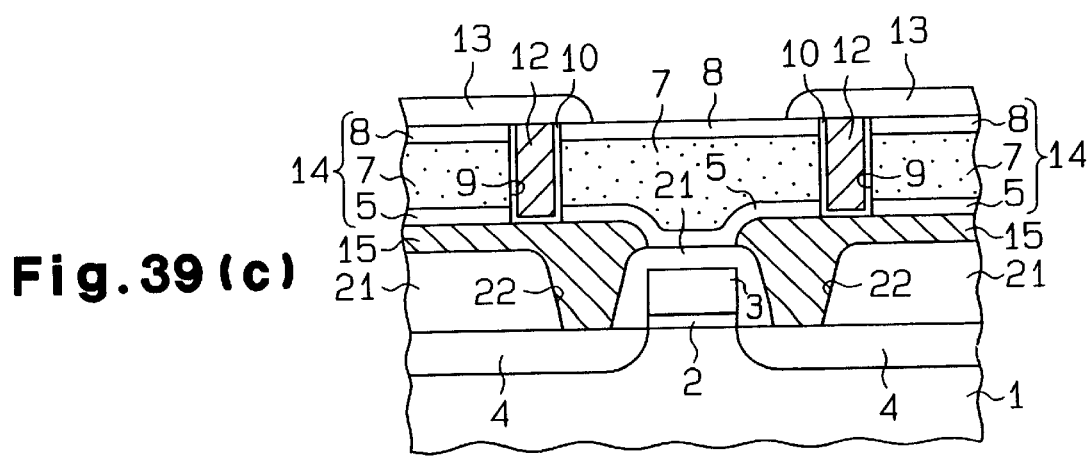

In Step (7) shown in FIG. 39(*a*), the via holes 9 are cleaned by sputter etching employing an inert gas (e.g., Ar), followed by formation of tungsten 11 on the titanium nitride thin film 10 including the bores of the via holes 9 by means of blanket-tungsten CVD.

In Step (8) shown in FIG. 39(*b*), the titanium nitride thin film 10 and the tungsten layer 11 are etched back anisotropically until the silicon oxide film 8 is exposed. The tungsten layer 11 is processed such that the layer 11 and the silicon oxide film 8 may be substantially on the same plane to form tungsten plugs 12 in the via holes 9. In Step (9) shown in FIG. 39(*c*), the oxide film present on the surface of each tungsten plug 12 is, as necessary, removed by sputter etching employing an inert gas (e.g. Ar).

Next, an Al alloy film, a Ti film and a TiN film are successively formed on the tungsten plugs 12 and the silicon oxide film 8 by means of magnetron sputtering. Then, the aluminum alloy film, the Ti film and the TiN film are subjected to patterning by undergoing procedures of resist application (not shown), light exposure and etching according to the ordinary lithographic technique and dry etching technique (such as RIE) to form an upper metal wiring 13 having a desired pattern.

As described above, in the second embodiment, wirings 13 are formed on the source and drain wirings 15 via the interlayer insulating film 14. In this embodiment again, the same actions and effects as in the first embodiment can be exhibited without affecting the MOS transistor and the source and drain wirings 15.

The present invention is not to be limited to the foregoing embodiments, and similar actions and effects may be exhibited if embodied as follows.

The organic SOG film 6 may be replaced with a polyimide film, a siloxane-modified polyimide film or the like. These films including the organic SOG films are referred to as organic polymers or organic spin-coating films.

The silicon oxide films 5 and 8 may be formed by a method other than the plasma CVD method, for example, atmospheric CVD method, vacuum CVD method, ECR plasma CVD method, optical pumping CVD method, TEOS-CVD method and PVD method. The gas used in the atmospheric CVD method is monosilane and oxygen ($SiH_4 + O_2$), and the films are formed at the temperature of 400° C. or lower. Meanwhile, the gas used in the vacuum CVD method is monosilane and nitrogen suboxide ($SiH_4 + N_2O$), and the films are formed at the temperature of 900° C. or lower.

The silicon oxide films 5 and 8 may be replaced with other insulating films having high mechanical strength in addition to the property of blocking water and hydroxyl groups, such as nitride film and silicate glass film. Such insulating film may be formed according to any method including CVD and PVD.

The source and drain electrodes 10 and the wiring 23 may be formed using conductive materials other than aluminum, such as copper, gold, silver, silicide, doped polysilicones, titanium nitride (TiN) and alloys including tungsten titanium (TiW), or a laminated structure of such materials. The modified SOG film 7 may be subjected to thermal treatment. In this case, the number of dangling bonds in the modified SOG film 7 is reduced, so that not only hygroscopicity but also water permeability of the film 7 can be reduced further.

The composition of the organic SOG film 6 may be replaced with the composition represented by the general formula (2). Further, the composition of the organic SOG film 6 may be replaced with an inorganic SOG film represented by the general formula (1), and the inorganic SOG film may be subjected to ion implantation. In this case, the water and hydroxyl groups contained in the inorganic SOG film can be reduced.

The modified SOG film 7 may be used as a passivation film. In this case, an excellent passivation film that can securely protect the device from mechanical and chemical attacks can be obtained.

While argon ion is employed as the ion to be implanted to the organic SOG film 6 in the foregoing embodiments, any ions may be employed as long as it can eventually modify the organic SOG film 6. Typically, boron ion or nitrogen ion can be suitably employed as well as argon ion. Further, the following ions are expected to exhibit sufficient effects.

(1) Inert gas ions other than argon: helium ion, neon ion, krypton ion, xenon ion and radon ion. Since the inert gas does not react with the organic SOG film 6, there is absolutely no fear of bringing about adverse effects by the ion implantation;

(2) Simple substance ions of Group IIIb, IVb, Vb, VIb, and VIIb elements excluding boron and nitrogen and ions of compounds containing such elements: particularly, ions of elements including oxygen, aluminum, sulfur, chlorine, gallium, germanium, arsenic, selenium, bromine, antimony, iodine, indium, tin, tellurium, lead and bismuth and compound ions containing such elements. Of these ions, although the metallic element ions are liable to reduce the dielectric constant of the organic SOG film 6 after the ion implantation, the amount of ion to be implanted is very small, so that they present no practical problem except for the cases where interlayer insulating films having particularly high dielectric constants are required;

(3) Ions of Group IVa and Va elements and ions of compounds containing such elements: particularly, ions of elements including titanium, vanadium, niobium, hafnium and tantalum and compound ions containing such elements. Since oxides of Group IVa and Va elements have high dielectric constants, the organic SOG film 6 after the ion implantation comes to have a high dielectric constant; and (4) Combinations of the ions described in (1) to (3): In this case, superior effects can be obtained by the synergistic effects to be brought about by the respective ions.

While ion is implanted to the organic SOG film 6 in the foregoing embodiments, the material to be implanted to the film 6 may not be limited to ions but may be atoms, molecules or particles, and they are all referred to as impurities in the present invention. Kinetic energy is applied to the impurities by means of the ion implantation method or the like for implanting the impurities to the organic SOG film 6.

As the sputtering method, the magnetron sputtering may be replaced, for example, by diode sputtering, high-frequency sputtering and four-pole sputtering.

As the sputter etching method, the inert gas employed here may be replaced with a reactive gas to carry out reactive ion beam etching (referred also to as RIBE, reactive ion milling) employing, for example, $CCl_4$ or $SF_6$.

The tungsten plugs 12 may be replaced with plugs made of, for example, aluminum, nickel, copper or molybdenum.

When tungsten is allowed to grow by means of blanket-tungsten CVD, titanium nitride facilitates formation of tungsten nuclei to promote growth of tungsten. The titanium nitride thin film 10 may be replaced with others having similar properties such as a titanium-containing compound such as titanium tungsten (TiW). Such titanium-containing compound has low contact resistance and also good adhesion with the substrate. Otherwise, tungsten simple substance may be employed. The silicon oxide film 8 may be omitted.

What is claimed is:

1. In a process for producing a semiconductor device having an upper conducting layer and a lower conducting layer that are spaced from each other and an organic insulating film for electrically insulating said upper conducting layer and said lower conducting layer from each other, said organic insulating film containing a contact hole having a plug embedded therein that connects said upper conducting layer and said lower conducting layer, said process comprising the steps of:

forming the organic insulating film on said lower conducting layer;

introducing one of a nitrogen ion and a boron ion, which serves as an impurity into said organic insulating film to decompose organic compounds contained in the organic insulating film and thus form a modified insulating film;

forming said contact hole in said modified insulating film;

forming said plug in said contact hole; and forming an upper conducting layer on said modified insulating film so as to be electrically connected to said plug.

2. The process according to claim 1, wherein said plug is made of a tungsten material.

3. The process according to claim 1, wherein material of the organic insulating film comprises a solution of a silicon-containing compound in an alcoholic solvent, and wherein said organic insulating film is formed on said lower conducting layer by spin-coating said solution and then removing the solvent to effect polymerization of the silicon-containing compound.

4. The process according to claim 3, wherein said silicon-containing compound contains an alkyl group or an aryl group.

5. The process according to claim 1, wherein said impurity is introduced to said organic insulating film by means of implantation.

6. The process according to claim 1, wherein said lower conducting layer contain a transistor formed on a substrate, wherein said organic insulating film is formed on said transistor.

7. The process according to claim 6 further comprising a step of forming an additional insulating film between said organic insulating film and said transistor, wherein said plug penetrates said additional insulating film to be electrically connected to said upper conducting layer and to said lower conducting layer.

* * * * *

UNITED STATES PATENT AND TRADEMARK OFFICE
CERTIFICATE OF CORRECTION

PATENT NO. : 6,177,343 B1  Page 1 of 1
DATED : January 23, 2001
INVENTOR(S) : Watanabe et al.

It is certified that error appears in the above-identified patent and that said Letters Patent is hereby corrected as shown below:

<u>Title page,</u>
Please add the following:
-- [30]   Foreign Priority Data

June 20, 1996   [JP]   Japan..............................8-181593 --

Signed and Sealed this

Twelfth Day of February, 2002

Attest:

JAMES E. ROGAN
*Attesting Officer*   *Director of the United States Patent and Trademark Office*